United States Patent
Ganesan et al.

(10) Patent No.: US 12,445,144 B2
(45) Date of Patent: Oct. 14, 2025

(54) CONTINUOUS-TIME ADC CALIBRATION TECHNIQUES

(71) Applicant: Analog Devices International Unlimited Company, Limerick (IE)

(72) Inventors: Asha Ganesan, Markham (CA); Donald W. Paterson, Winchester, MA (US); Sharvil Pradeep Patil, Toronto (CA); Nevena Rakuljic, Del Mar, CA (US)

(73) Assignee: Analog Devices International Unlimited Company, Limerick (IE)

( * ) Notice: Subject to any disclaimer, the term of this patent is extended or adjusted under 35 U.S.C. 154(b) by 264 days.

(21) Appl. No.: 18/139,779

(22) Filed: Apr. 26, 2023

(65) Prior Publication Data
US 2024/0364356 A1   Oct. 31, 2024

(51) Int. Cl.
  H03M 1/00  (2006.01)
  H03M 1/10  (2006.01)
  H03M 1/20  (2006.01)
  H03M 1/50  (2006.01)
  H03M 1/66  (2006.01)

(52) U.S. Cl.
  CPC ........... H03M 1/50 (2013.01); H03M 1/1009 (2013.01); H03M 1/201 (2013.01); H03M 1/662 (2013.01)

(58) Field of Classification Search
  CPC ...... H03M 1/50; H03M 1/1009; H03M 1/201; H03M 1/662; H03M 3/368; H03M 1/164; H03M 3/414; H03M 3/458; H03M 1/0854; H03M 1/12
  USPC .......................................... 341/126, 155, 144
  See application file for complete search history.

(56) References Cited

U.S. PATENT DOCUMENTS

| | | |
|---|---|---|
| 8,896,475 B2 | 11/2014 | Shibata |
| 9,203,426 B2 | 12/2015 | Zhao et al. |
| 9,735,797 B2 | 8/2017 | Zhao et al. |
| 10,432,210 B1 | 10/2019 | Yendluri et al. |
| 10,965,302 B1 | 3/2021 | Zhao et al. |
| 11,218,158 B1 | 1/2022 | Patil et al. |
| 2021/0194492 A1 | 6/2021 | Zhao et al. |
| 2024/0080033 A1* | 3/2024 | Patil .................... H03M 1/1047 |

OTHER PUBLICATIONS

"European Application Serial No. 23176552.0, Extended European Search Report mailed Nov. 30, 2023", 16 pgs.
"Adaptive digital noise-cancellation filtering using cross-correlators for continuous-time MASH ADC in 28nm CMO", 2017 IEEE Custom Integrated Circuits Conference (CICC), (Apr. 30, 2017), 1-4.

(Continued)

*Primary Examiner* — Jean B Jeanglaude
(74) *Attorney, Agent, or Firm* — Schwegman Lundberg & Woessner, P.A.

(57) ABSTRACT

CT ADCs based on continuous-time residue generation systems require accurate estimation of analog transfer functions. This is done by using a pseudo random bit sequence, injected using a DAC, that traverses the transfer function to be measured. Mismatch in the injection DAC introduces errors in the transfer function estimation and results in poor NSD at the ADC output. Techniques are described to improve the accuracy of the transfer function estimate despite DAC mismatch and despite the presence of an input signal.

20 Claims, 9 Drawing Sheets

(56) References Cited

OTHER PUBLICATIONS

Shibata, Hajime, "16.6 An 800MHz-BW VCO-Based Continuous-Time Pipelined ADC with Inherent Anti-Aliasing and On-Chip Digital Reconstruction Filter", 2020 IEEE International Solid-State Circuits Conference—(ISSCC), (Feb. 16, 2020), 260-262.

"U.S. Appl. No. 63/403,947, Provisional Application filed Sep. 6, 2022", 59 pgs.

Dong, Yunzhi, "A Continuous-Time 0-3 MASH ADC Achieving 88 dB DR With 53 MHz BW in 28 nm CMOS", IEEE Journal of Solid-State Circuits, 49(12), (Dec. 2014), 2868-2877.

Dong, Yunzhi, "A 72 dB-DR 465 MHz-BW Continuous-Time 1-2 MASH ADC in 28 nm CMOS", IEEE Journal of Solid-State Circuits, 51(12), (Dec. 2016), 2917-2927.

Dong, Yunzhi, "Adaptive Digital Noise-Cancellation Filtering using Cross-Correlators for Continuous-Time MASH ADC in 28nm CMOS", 2017 IEEE Custom Integrated Circuits Conference (CICC, (2017), 4 pgs.

Pavan, Shanthi, "Efficient Simulation of Weak Nonlinearities in Continuous-Time Oversampling Converters", IEEE Transactions on Circuits and Systems—I: Regular Papers, 57(8), (Aug. 2010), 1925-1934.

Reddy, Karthikeyan, "A 16-mW 78-dB SNDR 10-MHz BW CT Delta-Sigma ADC Using Residue-Cancelling VCO-Based Quantizer", IEEE Journal of Solid-State Circuits, 47(12), (Dec. 2012), 2916-2927.

Shibata, Hagime, "A 9GS s 1GHz-BW Oversampled Continuous-Time Pipeline ADC Achieving-161dBFS Hz NSD" Digest of Technical Papers—IEEE International Solid-State Circuits Conference Session 16.2, (2017), 3 pgs.

Shibata, Hajime, "An 800MHz-BW VCO-Based Continuous-Time Pipelined ADC with Inherent Anti-Aliasing and On-Chip Digital Reconstruction Filter", ISSCC 2020, Session 16, Nyquist and VCO-Based ADCs, 16.6, (2020), 3 pgs.

Shreier, R., "High-speed bandpass ADCs", Steyaert, M., et al. (eds) Analog Circuit Design. Springer, Dordrecht, (2006), 65-90.

"European Application Serial No. 23176552.0, Response filed Mar. 14, 2025 to Extended European Search Report mailed Nov. 30, 2023", 23 pgs.

\* cited by examiner

CONTINUOUS-TIME ADC CALIBRATION TECHNIQUES

FIELD OF THE DISCLOSURE

The present disclosure relates generally to the field of electronic circuits and, more particularly, to systems and methods for data conversion.

BACKGROUND

Analog signals and/or values can be produced in various kinds of circuit elements, such as signal generators, sensors, and antennas. However, there can be many instances where having digital signals or values can be beneficial, such as for further processing or storing of the signals or values. To utilize the benefits of having a digital signal or value when an analog signal or value has been produced, analog-to-digital converters (ADCs) have been developed for converting analog signals or values to digital signals or values.

ADCs can be found in many places such as broadband communication systems, audio systems, receiver systems, etc., and are used in a broad range of applications including communications, energy, healthcare, instrumentation and measurement, motor and power control, industrial automation, and aerospace/defense. For example, in precision measurement systems, electronics may be provided with one or more sensors to make measurements, and these sensors may generate an analog signal. The analog signal would then be provided to an ADC as an input to generate a digital output signal for further processing. In another example, an antenna may generate an analog signal based on the electromagnetic waves carrying information/signals in the air. The analog signal generated by the antenna is then provided as an input to an ADC to generate a digital output signal for further processing.

Designing an ADC is a non-trivial task because each application may have different needs in speed, performance, power, cost and size. As the applications needing ADCs grow, the need for accurate and reliable conversion performance also grows.

SUMMARY OF THE DISCLOSURE

CT ADCs based on continuous-time residue generation systems require accurate estimation of analog transfer functions. This is done by using a pseudo random bit sequence, injected using a DAC, that traverses the transfer function to be measured. The present inventors have recognized that mismatch in the injection DAC introduces errors in the transfer function estimation and results in poor NSD at the ADC output. This disclosure describes various techniques to improve the accuracy of the transfer function estimate despite DAC mismatch and despite the presence of an input signal.

In some aspects, this disclosure is directed to a continuous-time (CT) analog-to-digital converter (ADC), comprising: a delay circuit configured to generate a delay circuit output signal by applying a delay to an analog input signal; a sub-ADC circuit configured to generate a sub-ADC circuit output signal based on the analog input signal; a first sub-DAC circuit coupled to receive the sub-ADC circuit output signal and generate an analog representation of the sub-ADC circuit output signal, wherein the analog representation of the first sub-ADC circuit output signal is combined with the delay circuit output signal to generate a residue signal; an error estimation circuit configured to receive an ADC output signal and generate an error estimation circuit signal; an error correction circuit configured to receive the error estimation circuit signal and generate a digital error-correction signal; and an output node coupled to an input of the error estimation circuit and configured to generate the ADC output signal using: 1) the residue signal, 2) the sub-ADC circuit output signal, and 3) the digital error-correction signal.

In some aspects, this disclosure is directed to a method of operating a continuous-time (CT) analog-to-digital converter (ADC), the method comprising: applying a delay to an analog input signal to generate a delay circuit output signal; generating a sub-ADC circuit output signal based on the analog input signal; receiving, via a first sub-DAC circuit, the sub-ADC circuit output signal and generating an analog representation of the sub-ADC circuit output signal; generating a residue signal by combining an analog representation of the sub-ADC circuit output signal with the delay circuit output signal; receiving an ADC output signal and generating an error estimation circuit signal; receiving the error estimation circuit signal and generating a digital error-correction signal; and generating the ADC output signal at an output node using: 1) the residue signal, 2) the sub-ADC circuit output signal, and 3) the digital error-correction signal.

In some aspects, this disclosure is directed to a continuous-time (CT) analog-to-digital converter (ADC), comprising: a delay circuit configured to generate a delay circuit output signal by applying a delay to an analog input signal; a sub-ADC circuit configured to generate a sub-ADC circuit output signal based on the analog input signal; a first sub-DAC circuit coupled to receive the sub-ADC circuit output signal and generate an analog representation of the sub-ADC circuit output signal, wherein the analog representation of the first sub-ADC circuit output signal is combined with the delay circuit output signal to generate a residue signal; means for receiving an ADC output signal and generating an error estimation circuit signal; means for receiving the error estimation circuit signal and generating a digital error-correction signal; and an output node coupled to an input of the error estimation circuit and configured to generate the ADC output signal using: 1) the residue signal, 2) the sub-ADC circuit output signal, and 3) the digital error-correction signal.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
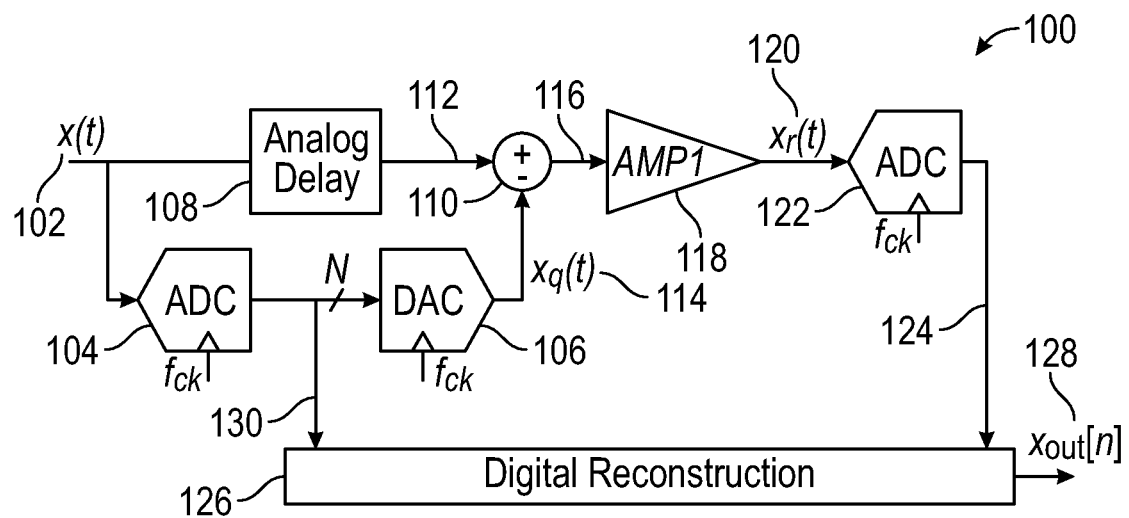
FIG. 1 is a schematic illustration of an example of a CT ADC.

ADCs are electronic devices that convert a continuous physical quantity carried by an analog signal to a digital number that represents the quantity's amplitude (or to a digital signal carrying that digital number). The conversion involves quantization of the analog input signal, i.e., a process of mapping input values from a continuous set of analog values to output values in a countable smaller set of digital values, so it would introduce a small amount of error. Typically, the quantization occurs through periodic sampling of the analog input signal. The result is a sequence of digital values (i.e., a digital signal) that represents conversion of a continuous-time (CT) and continuous-amplitude analog input signal to a discrete-time (DT) and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including noise spectral density (NSD), signal to noise ratio (SNR), signal-to-noise-and-distortion ratio (SNDR), effective number of bits (ENOB), total harmonic distortion (THD), total harmonic distortion plus noise (THD+N), and spurious free dynamic range (SFDR).

ADCs have many different designs, which can be chosen based on the application requirements and performance specifications. CT ADC (also sometimes referred to as a CT pipelined (CTP) ADC) refers to an ADC design that is based on CT residue generation. CT ADCs are increasingly popular in high-performance and high-speed data converters, partly due to their inherent anti-aliasing and their potential to achieve high sampling rates, driven by their feedforward architecture. In a CT pipeline stage of an ADC, a CT analog input signal is sent to two different paths. A first path, typically referred to as a "feedforward" path, includes a cascade of a quantizer (also referred to herein as a "sub-ADC") and a feedforward DAC (referred to in the following as a "sub-DAC"). A second path, typically referred to as a "forward" path, includes an analog delay circuit to align the delays of the input signal in the feedforward and forward paths.

A combiner may then subtract the output of the sub-DAC in the feedforward path to generate a residue signal from the output of the analog delay of the forward path. This residue signal may then be processed, e.g., filtered and amplified by an amplifier, and the processed residue signal may be provided to subsequent stages of the ADC or to a backend-ADC for the generation of the final output signal of the CT ADC based on the residue signal and based on the digital output of the sub-ADC of the feedforward path. For example, the sub-ADC may output a lower resolution and less accurate digital representation of the input signal value (e.g., a 5-bit digital value), while the residue signal indicative of the difference between the coarse conversion of the input value by the sub-ADC and the actual input value may allow generating a higher resolution and more accurate digital representation of the input signal value (e.g., a 10—or a 16-bit digital value).

A sub-DAC of a CT ADC includes a plurality of unit elements (UEs) configured to convert digital bits that they receive at their inputs to analog values. Although designed to be identical to one another, real-life UEs of a single sub-DAC may differ from one another due to manufacturing variations, causing so-called "mismatch errors." More generally, UEs of a single sub-DAC may differ from one another due to process, voltage, or temperature (PVT) variations, causing a multitude of potential sub-DAC errors. As a result, keeping the distortion of a CT ADC within acceptable limits, e.g., below-80 decibels relative to full scale (dBFS), is very challenging.

CT ADCs based on continuous-time residue generation systems require accurate estimation of analog transfer functions. This is done by using a pseudo random bit sequence, injected using a DAC, that traverses the transfer function to be measured. The present inventors have recognized that mismatch in the injection DAC introduces errors in the transfer function estimation and results in poor NSD at the ADC output. This disclosure describes various techniques to improve the accuracy of the transfer function estimate despite DAC mismatch and despite the presence of an input signal.

FIG. 1 is a schematic illustration of an example of a CT ADC. As shown in FIG. 1, the ADC 100 may be configured to receive a CT analog input signal, x(t), 102, e.g., an analog voltage Vin (t).

A value of the analog input signal x(t) is sent to two different paths: a feedforward path and a forward path. The feedforward path includes a cascade of a quantizer 104 and a feedforward DAC 106. The forward path includes an analog delay circuit 108, configured to apply an analog delay to the input signal 102. Thus, the CT analog input x(t) 102 (i.e., a given analog value of the input signal x(t)) is applied to the delay circuit 108 in the forward path and to a cascade of an N-bit ADC implementing the quantizer 104 and an N-bit DAC implementing the feedforward DAC 106, each of which may be clocked at a sampling rate of fck in the feedforward path.

The quantizer 104 may be configured to derive and output (an output signal 230) a digital value (e.g., CODE1) representing the analog value of the input signal x(t) provided thereto. For example, CODE1 may be a relatively low-resolution digital representation of X, e.g., VIN (i.e., the held analog value at a sampling instant t=TO). The ADC 100 may be configured to derive and process a residue of X(e.g., of VIN) with respect to CODE1 as a step of a method to derive a higher resolution and more precise digital representation of X(e.g., of VIN). Specifically, the feedforward DAC 106 may be configured to derive and output (an output signal xq(t), 114) an analog representation of CODE1 and a difference between X and the analog representation of CODE1 is a residue value VRES (i.e., a value of the residue signal 116).

For example, a combiner (e.g., a subtractor) 110 may generate a residue signal 116 based on a delayed input signal 112 (which is the output of the forward path) and an output, xq(t), 114 of the DAC 106 (which is the output of the feedforward path). For example, in some embodiments, the combiner 110 may generate the residue signal 116 by subtracting the feedforward path output 114 from the forward path output 112, or the other way around. The residue signal 116 may be seen as a signal indicative of the quantization error arising from the quantization process performed by the quantizer 104. Therefore, in some of the subsequent drawings the residue signal 116 is labeled as "eq" (where "e" stands for "error" and "q" stands for "quantization").

Figure 2:
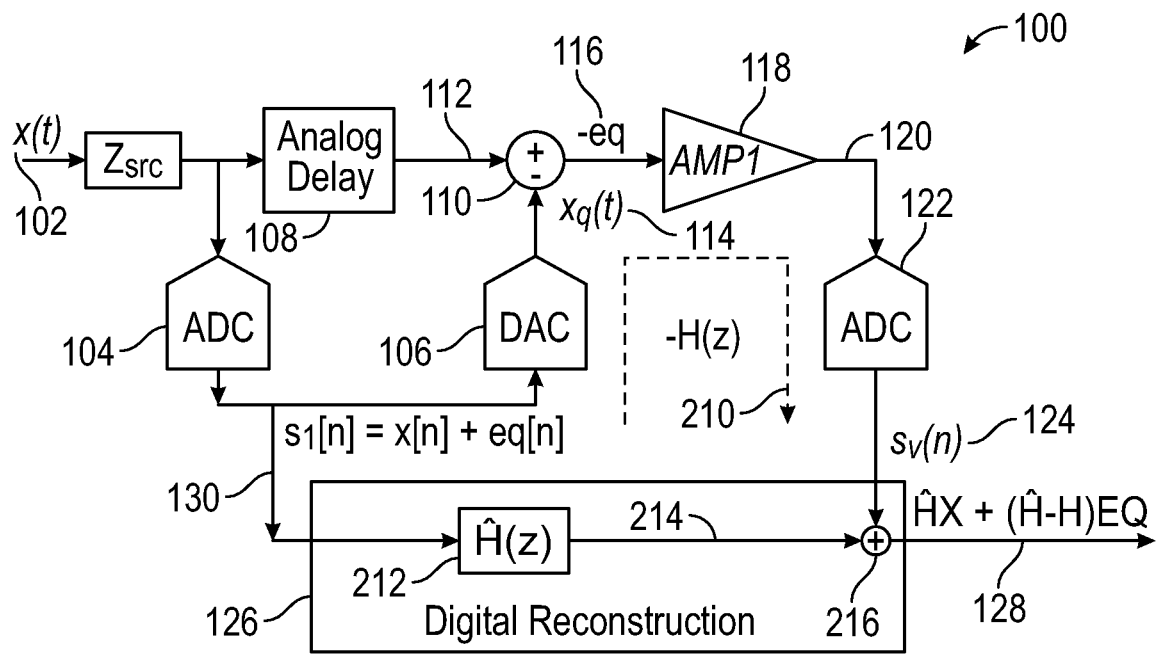
FIG. 2 is a schematic illustration of an example of the CT ADC of FIG. 1, further illustrating example details of the digital reconstruction circuit.

The residue signal 116 may then be processed, e.g., filtered and amplified by an amplifier/filter, AMP1, 118, and the processed residue signal 110 may be provided to subsequent pipeline stages that may be implemented in the ADC 100 (subsequent pipeline stages not specifically shown in FIG. 2). Eventually (e.g., after the last pipeline stage of the ADC 100), a signal based on the processed residue signal 110 may be provided to a backend ADC 122, to be digitized by the backend ADC 122 to generate a digital residue signal 124. For example, the backend ADC 122 may be configured to generate a digital representation CODE2 of a residue value VRES accounting for a factor of gain A provided by the amplifier 118.

The ADC 100 may further include a digital reconstruction circuit 126, configured to generate an ADC output xout[n] 128 based on the digital residue signal 124 output by the backend ADC 122, a digital signal 130 output by the quantizer 104 (e.g., the signal s1[n] labeled in some of the subsequent drawings), and any digital signals generated by the quantizers in the other pipeline stages in the ADC (not shown in FIG. 2). For example, the digital reconstruction circuit 126 may be configured to derive a high-resolution representation of a given value of the input signal 102 (e.g., of the value VIN) based on a combination of CODE1 and CODE2.

The quantizer 104, the DAC 106, the delay circuit 108, the combiner 110, and the amplifier 118 may be considered to be a first stage, or a residue generation arrangement, of the ADC 100. In some embodiments, the ADC 100 may include multiple such stages (i.e., multiple CT stages), coupled in series, i.e., the input signal 102 for a stage i+1 may be based on (e.g., may be substantially the same as) the amplified residue signal 110 of a stage i, where i may be a positive integer indicating the positions of stages in a series of consecutive stages of the ADC 100 (e.g., an integer between 1 and M if the ADC 100 includes M residue generation stages).

In some embodiments, each of such stages may include a respective (i.e., own) digital reconstruction circuit 126, where the digital reconstruction circuit 126 of the stage i may be configured to generate an ADC output based on the digital signal 130 output by the quantizer 104 of the stage i and the ADC output generated by the digital reconstruction circuit 126 of the stage i+1, and the digital reconstruction circuit 126 of the last stage M may be configured to generate its ADC output based on the digital signal 130 output by the quantizer 104 of the stage M and the digital residue signal 124 output by the backend ADC 122, configured to receive a signal indicative of the residue signal 116 output by the combiner 110 of the stage M (e.g., to receive the signal 110).

In other embodiments, the first stage of the ADC 100 may be coupled to a second stage, configured to process a signal based on the residue signal output by the first stage, but the second stage may be a DT stage.

FIG. 2 is a schematic illustration of an example of the CT ADC 100 of FIG. 1, further illustrating example details of the digital reconstruction circuit 126. As described above, the process of quantization performed by the quantizer of the feedforward path, e.g., the quantizer 104 (also referred to herein as a sub-ADC), may result in a quantization error which is represented by the residue signal 116 (i.e., the output signal of the combiner 110). Hence, FIG. 2 labels the output signal of the combiner 110 as a signal "—eq". While the residue signal 116 is an analog signal indicative of the quantization error of the quantizer 104, the output signal 130 of the quantizer 104 is a digital signal, and is also indicative of the quantization error of the quantizer 104, as is shown in FIG. 2 with the quantizer output signal 130 being a digital signal s1[n]=x[n]+eq[n], where x[n] is a sampled version of the analog input signal x(t) (i.e., the signal 102) (e.g., X[n] may represent an analog signal sampled at an instance n*Ts, where Ts is the sampling period, and n is an integer indicative of the sampling instance) and eq[n] is the quantization error signal generated by the operation of the quantizer 104.

A path 210, shown in FIG. 2 with a dashed arrow, indicates a path for signals between the input to the feedforward DAC 106 and the output of the backend ADC 122. A transfer function undergone by the signals travelling the path 210 may be labeled as "—H(z)", as shown in FIG. 2 with this label placed within the path 210. The digital reconstruction circuit 126 may then be configured to generate the output signal 128 based on the estimate of the transfer function H(z), the estimate illustrated as a transfer function $\hat{H}(z)$ (in accordance with a common mathematical notation to use the hat sign to indicate a function is an estimate).

Different embodiments are possible for the digital reconstruction circuit 126 to be configured to generate the output signal 128 based on the estimate $\hat{H}(z)$ of the transfer function H(z). In some embodiments, the digital reconstruction circuit 126 may include a transfer function application circuit 212 and a combiner 216. One such embodiment is shown in FIG. 2, illustrating that the transfer function application circuit 212 may be configured to apply the estimate $\hat{H}(z)$ to a signal based on the quantizer output 130, to generate an output signal 214, and the combiner 216 may then be configured to generate the output signal 128 by combining (e.g., adding) a signal indicative of the output signal 214 and a signal based on the backend ADC output 124, sv[n]. In such an embodiment, the output signal 128 may be represented as $\hat{H}X+(\hat{H}-H)$ EQ, where X is a frequency-domain representation of x[n], the sampled version of the analog, time-domain, input signal x(t) and EQ is a frequency-domain representation of the time-domain quantization error signal eq.

As the foregoing description illustrates, for the quantization error eq to be canceled in digital reconstruction, the estimate $\hat{H}(z)$ should accurately represent the actual transfer function H(z). In other words, if the estimate $\hat{H}(z)$ accurately represents the actual transfer function H(z) so that $\hat{H}(z)=H(z)$, the second term of the output signal 128 shown in FIG. 2 (i.e., $(\hat{H}-H)$ EQ) would be canceled and the output signal 128 would only include the first term (i.e., $\hat{1}X$).

Figure 3:
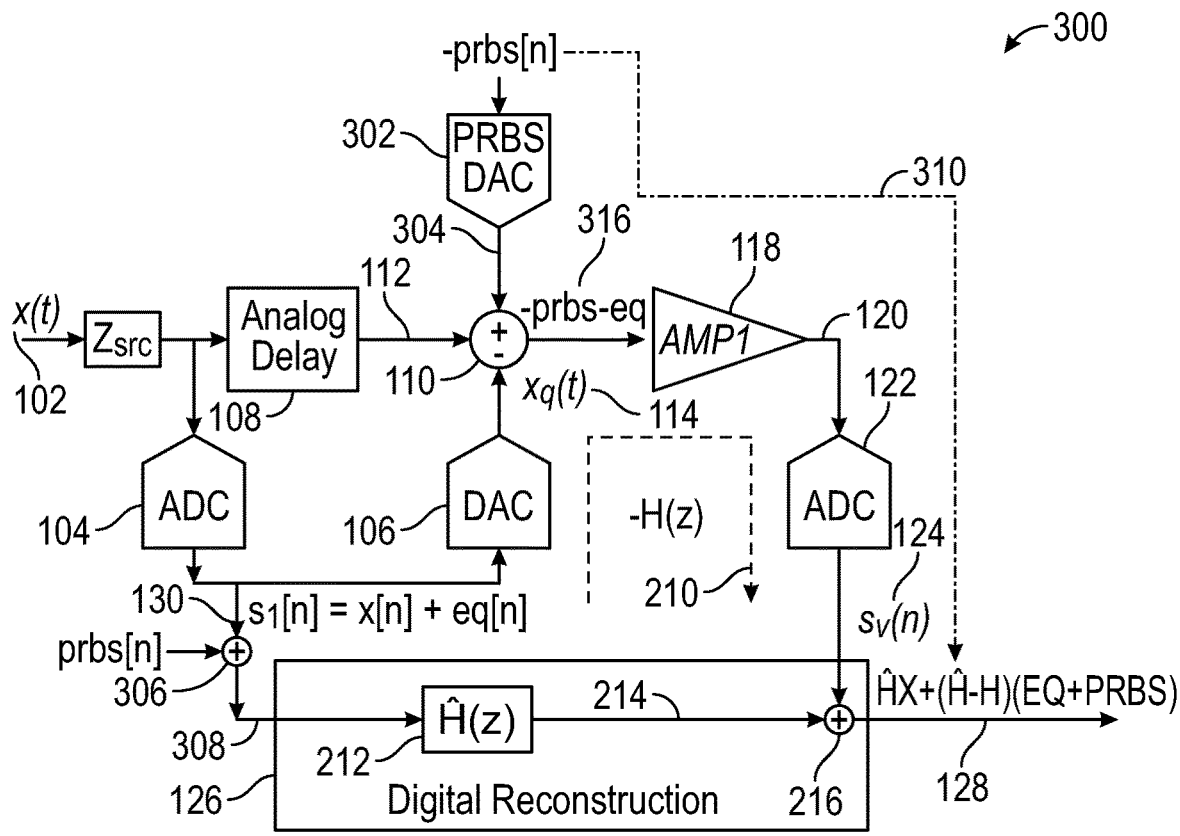
FIG. 3 is a schematic illustration of an example of a CT ADC similar to that shown in FIG. 2, further configured to use a test signal.

FIG. 3 is a schematic illustration of an example of a CT ADC similar to that shown in FIG. 2, further configured to use a test signal. In FIG. 3, the same reference numerals and letters as those used in FIG. 2 are intended to illustrate the same or analogous features as those described with reference to the ADC 100 so that, in the interests of brevity, their description does not have to be repeated for FIG. 3. The ADC 300 is similar to the ADC 100 except that the ADC 300 is further configured to use a test signal, e.g., a pseudo random bit sequence (PRBS).

As shown in FIG. 3, an analog version of a digital test signal, prbs[n], may be provided to the combiner 110 as an analog test signal 304. In some embodiments, the digital version of the test signal prbs[n] may be generated by a test signal generator (not shown in FIG. 3) and provided to a DAC 302, configured to convert the digital test signal prbs[n] to the analog test signal 304. The combiner 110 may then be configured to combine the analog test signal 304 with the analog delayed input signal 112 (i.e., the output of the forward path) and the output, xq(t), 114 of the DAC 106 (i.e., the output of the feedforward path). For example, in some embodiments, the combiner 110 may be configured to generate a signal 316 that may be referred to as a "test residue signal" by adding the analog test signal 304 to the analog delayed input signal 112 and subtracting the feedforward path output 114 from the forward path output 112, or the other way around.

The test residue signal 316 may be seen as a signal indicative of the quantization error arising from the quantization process performed by the quantizer 104, as well as of the test signal injected into the residue signal 116 in order to improve accuracy of the transfer function estimation. Therefore, the residue signal 316 is labeled as "—prbs—eq".

A path 310, shown in FIG. 3 with a dash-dotted arrow, indicates a path for the test signal prbs[n] through the combiner 110 and the backend ADC 122 to the output signal 128. If the DAC 302 matches the feedforward DAC 106, then, ideally, both the signal eq and the signal prbs undergo the same transfer function—H(z), before emerging at the output 124 of the backend ADC 122. Cross-correlating this output 124 with—prbs then provides the estimate of H(z), i.e., Ĥ(z), which may be used by the transfer function application circuit 212 of the digital reconstruction circuit 126 in the manner described above.

To effectively cancel the test signal injected into the residue signal 116 from the ADC output 128, a digital version of the test signal may be injected into the output 130 of the quantizer 104. As shown in FIG. 3, this may be done using a combiner 306, configured to add the digital test signal prbs[n] to the quantizer output signal 130 to generate a modified digital signal 308, which may, e.g., be s1[n]+prbs[n]=x[n]+eq[n]+prbs[n]. The modified digital signal 308 may then be provided to the digital reconstruction circuit 126 to be processed as discussed above for the quantizer output signal 130, except that now the signal 308 replaces the quantizer output signal 130 in being processed by the digital reconstruction circuit 126. Adding the digital test signal prbs[n] to the quantizer output signal 130 to generate the modified digital signal 308 to be processed by the digital reconstruction circuit 126 can help reduce or eliminate presence of the digital test signal prbs[n] in the output signal 128, thus reducing noise.

When the test signal prbs[n] is used in this manner, ideally, the output signal 128 may be represented as ĤX+(Ĥ−H) (EQ+PRBS), where PRBS is a frequency-domain representation of the digital, time-domain test signal prbs[n] or the analog version thereof. Similar to FIG. 2, for the embodiment shown in FIG. 3, if the estimate Ĥ(z) accurately represents the actual transfer function H(z) so that Ĥ(z)=H(z), the second term of the output signal 128 shown in FIG. 3 (i.e., (Ĥ−H) (EQ+PRBS)) would be canceled and the output signal 128 would only include the first term (i.e., ĤX).

The feedforward architecture of the CT ADC 300 requires accurate estimation of the transfer function undergone by the pipeline stage's sub-ADC quantization error. As described above, the transfer function estimation can be performed using a PRBS that traverses almost the same transfer function as the quantization error. The only difference in the two comes via the DACs through which they are injected into the backend: the PRBS is injected through the PRBS-DAC 302, whereas quantization error goes through the main sub-DAC 106 of the pipeline stage. Any mismatch between the two DACs will result in errors in the estimation of the transfer function (DRF), causing leakage of quantization error from the sub-ADC of the pipeline stage into the output, thus limiting achievable NSD and anti-aliasing. The transfer function undergone by the sub-ADC data as well as the PRBS DAC mismatch terms drift with temperature and with circuit aging. Hence, foreground and/or background calibrations can be performed to make sure that the DRF is as accurate as possible.

This disclosure describes four techniques to achieve better DRF accuracy which in turn provides lower NSD. The first three techniques involve an enhancement to the PRBS DAC based transfer function estimation while the last technique describes transfer function estimation without the involvement of a PRBS DAC.

The first technique is a foreground calibration where a measure of the output noise power/NSD in the absence of input signal can be used as a measure of the transfer function estimation error. The second technique exploits the fact that if a known signal source is added to the input signal of the sub-ADC, a measurement of the known signal at the reconstructed ADC output is a representation of the transfer function estimation error and associated quantization error leakage. The third technique proposes a measurement of out-of-band (OOB) NSD as a measure of the transfer function estimation error. Finally, the fourth technique uses a known signal source at the input of the sub-ADC and uses a feedback-based method for accurate transfer function estimation.

Figure 4:
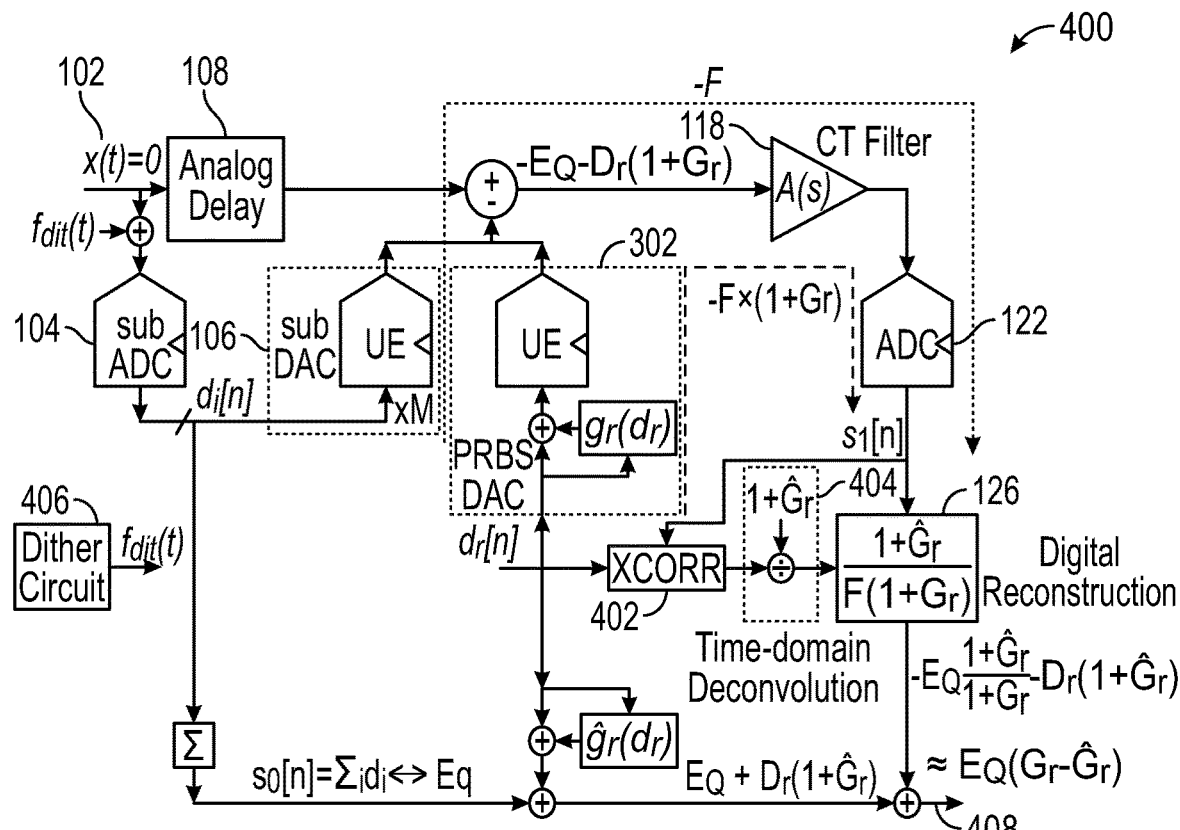
FIG. 4 is a schematic illustration of an example of a CT ADC configured to perform a digital correction to improve transfer function accuracy.

FIG. 4 is a schematic illustration of an example of a CT ADC 400 configured to perform a digital correction to improve transfer function accuracy. FIG. 4 illustrates the first technique, which is a foreground calibration where a measure of the output noise power/NSD in the absence of input signal (x(t)=0), is used as a measure of the transfer function estimation error.

The approach of FIG. 4 is based on the realization that the erroneously estimated transfer function, $F(1+G_r)(z)$, can be corrected by dividing it with $1+G_r(z)$. This requires prior knowledge of the PRBS-DAC's error transfer function $G_r$. The CT ADC 400 can iteratively estimate $G_r$ as $\widehat{G_r}$ with the following procedure (see FIG. 4):

1. Make input x(t)=0, apply a PRBS signal $d_r$, and perform DRF estimation using cross correlation (XCORR 402). This will give the impulse response of the erroneous transfer function: $F(1+G_r)(z)$.
2. Make starting estimates for the PRBS-DAC slice's static and timing errors: $\hat{e}_s=0$ and $\hat{e}_t=0$.
3. Generate (via a dither circuit 406, such as including a linear feedback shift register (LFSR)) and apply a dither sequence signal, $f_{dit}$ to the sub-ADC.

4. Derive PRBS-DAC error filter estimate as: $\widehat{g_r}[n] =$ [$\hat{e}_s + \hat{e}_t - \hat{e}_t$]. From this, the following is obtained:

$$1 + \widehat{G_r} \leftrightarrow [1 + \hat{e}_s + \hat{e}_r, -\hat{e}_t]$$

5. Use $1 + \widehat{G_r}$ to correct the estimated DRF using time-domain deconvolution block 404 (equivalent to division in the frequency domain).
6. Apply the digital FIR filter $\widehat{g_r}$ to $d_r$ before it is added to the sub-ADC's (summed) output. This ensures that the DRF correction does not cause leakage of $d_r$ signal's energy to the ADC output.
7. Perform reconstruction using corrected DRF and measure ADC output NSD (or RMS noise). The dither sequence signal injects quantization error $E_Q$ into the sub-ADC output which will leak into the ADC output and increase noise if $\widehat{G_r} \neq G_r$. Iterate until the ADC's output noise is minimized, which will happen when $\widehat{G_r} = G_r$.
8. Update $\hat{e}_s$ and $\hat{e}_t$ (such as using gradient descent or linear search) and repeat steps 3-6.
9. If $\widehat{G_r} = G_r$, both $d_r$ and sub-ADC dither-induced quantization error are cancelled during reconstruction, and output noise is minimized. Optimal $\hat{e}_s$ and $\hat{e}_t$ are when output noise is minimized. The ADC output 408 generates an ADC output signal.

A PRBS-DAC's mismatch errors can be modeled using the static($\hat{e}_s$), timing ($e_t$), and switching errors ($e_{sw}$) of the PRBS-DAC relative to that of the "average" sub-DAC UE (assumed mismatch free). Both $e_s$ and $e_t$ affect the DRF estimation by modifying the net transfer function traversed by $d_r$ and estimated using cross correlation. However, $e_{sw}$ does not affect it.

Figure 5:
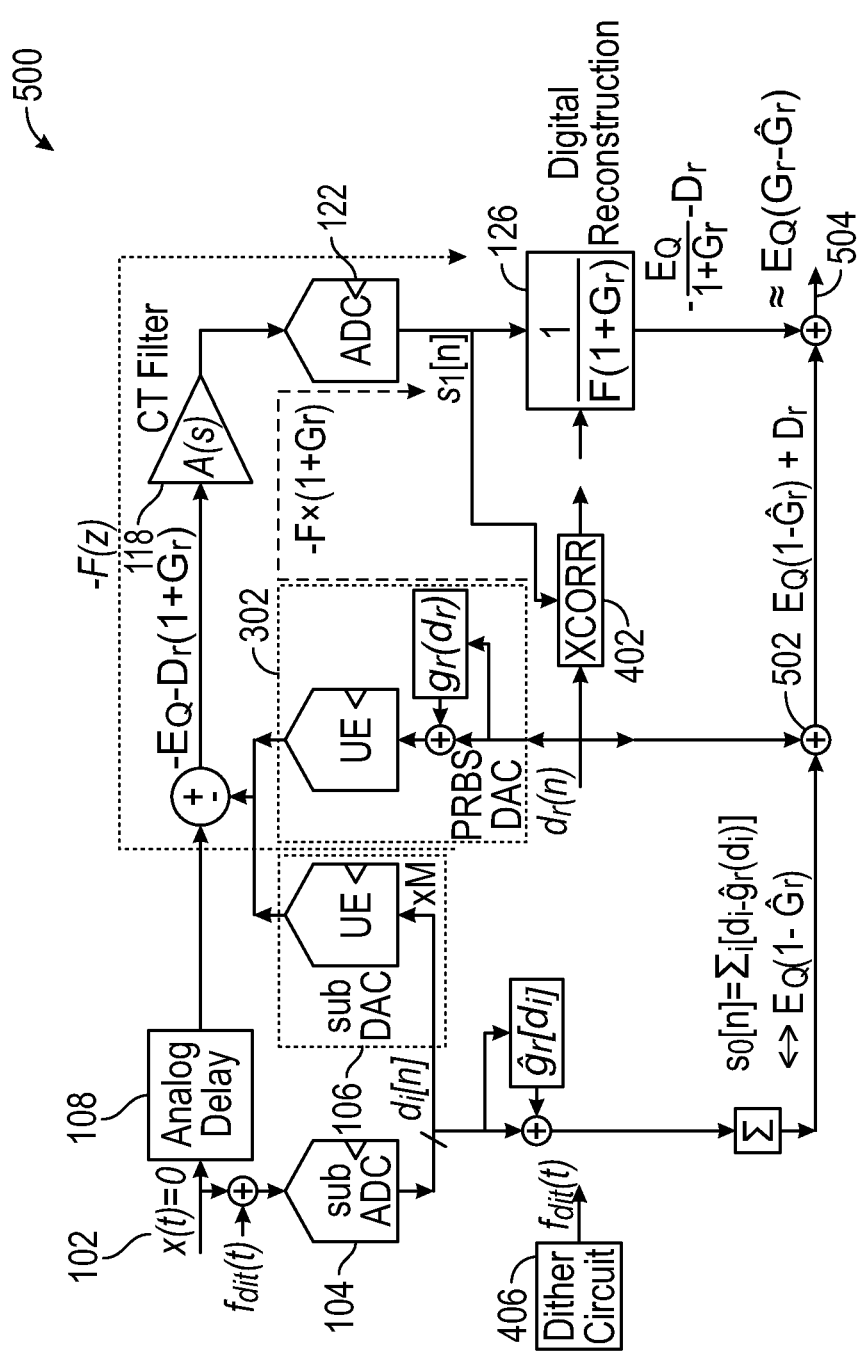
FIG. 5 is a schematic illustration of another example of a CT ADC configured to perform a digital correction to improve transfer function accuracy.

FIG. 5 is a schematic illustration of another example of a CT ADC 500 configured to perform a digital correction to improve transfer function accuracy. FIG. 5 illustrates an alternative approach to performing deconvolution.

The PRBS-DAC input, $d_r$, undergoes and estimates a transfer function that is slightly different compared to that undergone by the sub-ADC quantization error. The deconvolution method described with respect to FIG. 4 attempts to correct this estimated transfer function. Alternatively, the CT ADC 500 can adjust the transfer function undergone by the sub-ADC quantization error so that it can match that undergone by the (mismatched) PRBS-DAC input using the steps below:

1. Make input x(t)=0, apply $d_r$, and perform DRF estimation using cross correlation, which will give the impulse response of the erroneous transfer function: $F(1+G_r)(z)$.
2. Make starting estimates for the PRBS-DAC slice's static and timing errors: $\hat{e}_s = 0$ and $\hat{e}_t = 0$.
3. Derive PRBS-DAC error filter estimate as: $\widehat{g_r}[n] =$ $\hat{e}_s + \hat{e}_t - \hat{e}_t$. $1 + \widehat{G_r} \leftrightarrow [1 + \hat{e}_s + \hat{e}_r, -\hat{e}_t]$
4. Apply the digital FIR filter $-\widehat{g_r}$ to each output bit $d_i$ from the sub-ADC.
5. Apply a dither sequence signal, $f_{dit}$, to the sub-ADC, perform reconstruction and measure ADC output NSD (or RMS noise). The dither sequence signal injects quantization error $E_Q$ into the sub-ADC output. It goes through the additional filter $-\widehat{g_r}$ (from step 5), so that upon summation the net output at $S_0$ is $E_Q(1 - \widehat{G_r})$. At the combiner 502 (e.g., summer) that generates the final ADC output, we now see $E_Q(1 - \widehat{G_r})$ on the left path and $$-\frac{E_Q}{(1 + G_r)}$$

on the top one. ($D_r$ gets cancelled is ignored.) Since $$-\frac{E_Q}{(1 + G_r)} \approx -E_Q(1 - G_r),$$

the output of the combiner 502 is $E_Q(G_r - \hat{G}_r)$. The quantization error will thus leak into the ADC output and increase noise if $\hat{G}_r \neq G_r$. The CT ADC 500 can iterate until the ADC's output noise is minimized, which will happen when $\hat{G}_r = G_r$.

6. Update $\hat{e}_s$ and $\hat{e}_t$ (such as using gradient descent or linear search) and repeat steps 3-5.
7. If $\hat{G}_r = G_r$, both $d_r$ and sub-ADC dither-induced quantization error are cancelled during reconstruction, and output noise is minimized. Optimal $\hat{e}_s$ and $\hat{e}_t$ are when output noise is minimized. The ADC output 504 generates an ADC output signal.

Figure 6:
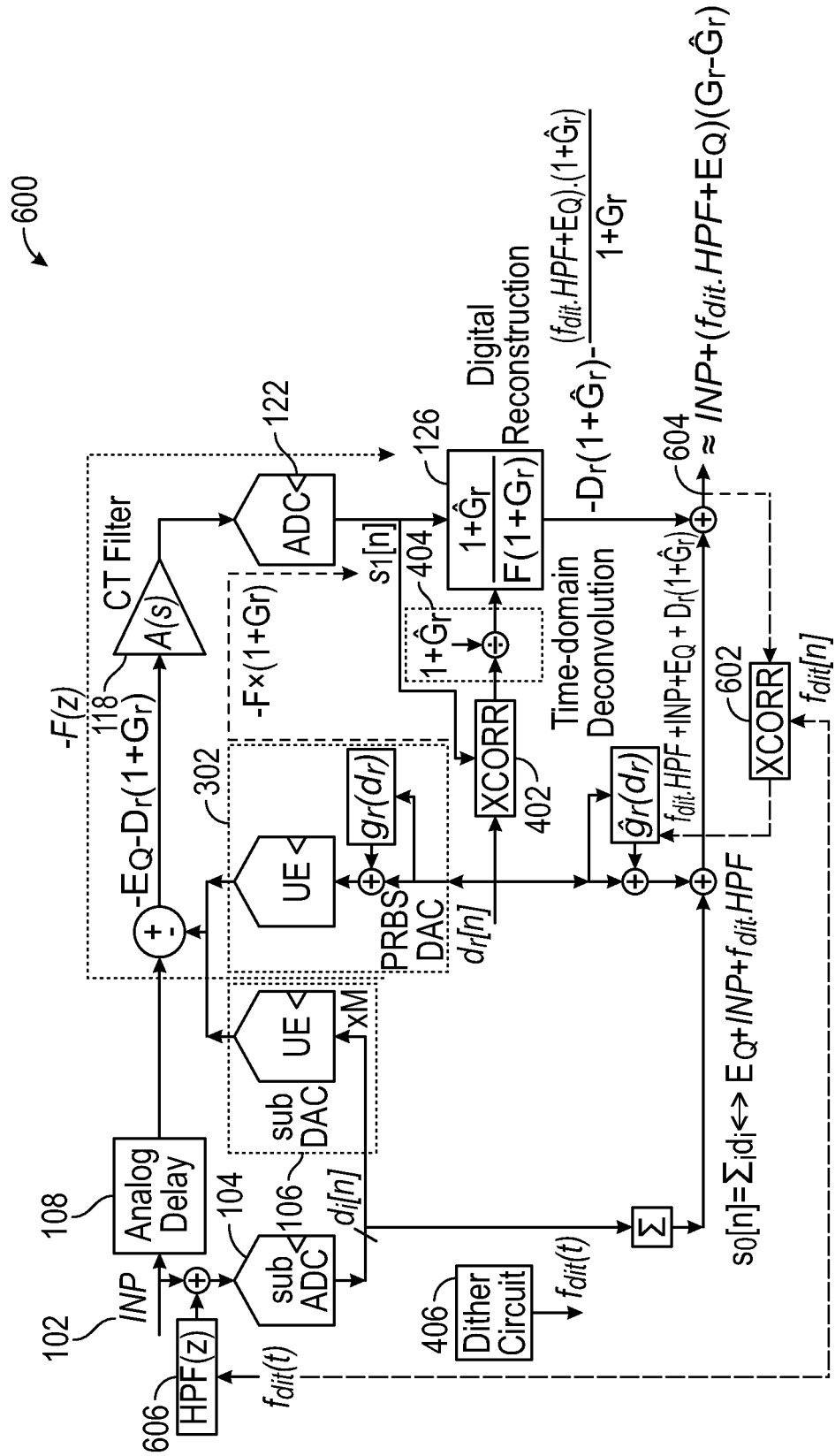
FIG. 6 is a schematic illustration of another example of a CT ADC configured to perform a digital error estimation and correction to improve transfer function accuracy.

FIG. 6 is a schematic illustration of another example of a CT ADC 600 configured to perform a digital error estimation and correction to improve transfer function accuracy. FIG. 6 illustrates the second technique, which exploits the fact that if a known signal source is added to the input signal of the sub-ADC, a measurement of the known signal at the reconstructed ADC output is a representation of the transfer function estimation error and associated quantization error leakage.

A dither circuit can generate a known dither signal, $f_{dit}$, such as a PRBS sequence, that can be injected at the input of the quantizer 104 (also known as a sub-ADC). To restrict its contribution to STGO residue, the dither sequence signal, $f_{dit}$, can be passed through an analog high-pass filter (HPF) whose transfer characteristic is known. An exact equivalent discrete-time transfer function is represented as HPF(z). The amplitude of the dither sequence signal can be tunable to address both foreground and background calibrations.

FIG. 6 depicts a representation of the dither sequence signal, $f_{dit}$, leaking at the reconstructed output. Assume that no correction is applied (i.e.,) $\hat{G}_r(z)$ is 0. The dither sequence signal, $f_{dit}$, passes through two signal paths: a first path includes the sub-ADC 104, the sub-DAC 106, the amplifier 118 (also referred to as a CT filter), the backend ADC 122, and the digital reconstruction filter (DRF) 126, and a second path includes the only the sub-ADC 104.

Assume, without loss of generality, that the sub-ADC transfer function is unity and has no non-idealities. The transfer function of the dither sequence signal, $f_{dit}$, through the first path can then be represented as HPF(z)x−F(z)/F'(z), while the transfer function of the second path is HPF(z).

Because the outputs of the two paths are summed to generate the final ADC output, the net transfer function undergone by the dither sequence signal, $f_{dit}$, is the sum of the transfer functions of the two paths. Assuming that the transfer function of the flash is perfectly linear, the net transfer function can be expressed as:

$$HPF(z) - HPF(z).F(z)/F'(z) = HPF(z) - HPF(z).F(z)./F'(z)$$
$$= HPF(z).[F'(z) - F(z)]./F'(z)$$
$$= HPF(z).G_r(z)/(1 + G_r(z))$$
$$\approx HPF(z).G_r(z)$$

Cross-correlation 602 of the ADC's reconstructed output 604 with the dither sequence signal, $f_{dir}$, gives the impulse response of this transfer function.

If there is no mismatch in the DAC, then $G_r(z)=0$, and the cross-correlation result is 0. A non-zero output, on the other hand, reveals mismatch and transfer function estimation error, which can then be corrected until the XCORR output of the cross-correlation 602 goes to zero. The ADC output 604 generates an ADC output signal.

The foreground calibration (input signal set to 0) techniques presented above with respect to FIGS. 4 and 5 also involve injection of the dither sequence signal, $f_{dir}$, at the input of the sub-ADC 104, but the target there was to minimize the quantization error leakage at the output by using NSD as the leakage measurement. However, since the target in FIG. 6 is to minimize the correlation between the dither sequence signal, $f_{dir}$, and the final ADC output 604, the technique can be adapted for both foreground as well as background calibrations (input signal is not set to 0).

The CT ADC 600 can adjust the transfer function undergone by the sub-ADC quantization error so that it can match that undergone by the (mismatched) PRBS-DAC input using the steps described above with respect to FIG. 4 or FIG. 5. However, the error metric measured in this technique is not the output noise power and is instead the cross-correlation of the final output with injected dither sequence signal, $f_{dir}$. The amplitude of the dither sequence signal, $f_{dir}$, should be increased so as to cause the Flash codes to toggle.

In some examples, it can be desirable to include an optional high pass filter 606 configured to receive the dither sequence signal, $f_{dir}$, and apply a filtered representation of the dither sequence signal to an input of the sub-ADC 104.

An alternative approach to performing static and timing error background estimation is now described. The PRBS-DAC input, $d_r$, undergoes and estimates a transfer function that is slightly different compared to that undergone by the sub-ADC quantization error. The technique in FIG. 6 does not focus on in-band or out-of-band contents and mainly focusses on correlation results. In contrast, an alternative approach is based on the fact that if in-band NSD gets worse because of PRBS DAC mismatch, out of band NSD also gets worse.

In the alternative approach, described below with respect to FIG. 7, the correction factors can be adjusted based on an out of band NSD, which can be measured on-chip or off-chip. This technique assumes that there are not any out of band contents at the input to the ADC. In some implementations, measuring NSD on-chip may not be feasible and hence, high-pass filtering the reconstructed output and then measuring mean-square will be an equivalent factor. It is important to note that this problem cannot be solved by gradient descent as the measured RMS has cross-products of $e_s$ and $e_t$.

Figure 7:
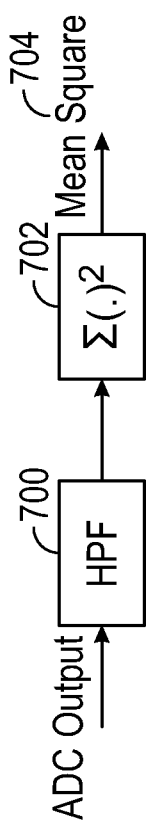
FIG. 7 is a block diagram illustrating techniques to measure power of the out-of-band signals.

FIG. 7 is a block diagram illustrating techniques to measure power of the out-of-band signals. FIG. 7 illustrates the third technique, which utilizes a measurement of out-of-band (OOB) NSD as a measure of the transfer function estimation error.

As shown in FIG. 7, the ADC output signal, such as from the ADC output 604 of FIG. 6, is coupled to a high pass filter (HPF) 700. The HPF 700 outputs a filtered representation of the ADC output signal that is applied to a mean-square circuit 702, which measures and outputs the mean-square as an output signal 704. Calibration of a CT ADC circuit can be performed as follows:

1. Apply a PRSB sequence, $d_r$, and perform DRF estimation using cross correlation. This will give the impulse response of the erroneous transfer function: $F(1+G_r)(z)$.
2. Make starting estimates for the PRBS-DAC slice's static and timing errors: $\hat{e}_s=0$ and $\hat{e}_t=0$.
3. Derive PRBS-DAC error filter estimate as: $\widehat{g_r}[n]=[\hat{e}_s+\hat{e}_t, -\hat{e}_t]$.
4. Apply the digital FIR filter $\widehat{g_r}$ to the PRBS DAC correction block in digital end.
5. Measure RMS of the reconstructed ADC output after HPF, such as in FIG. 7.
6. The quantization error will leak into the ADC output and increase noise if $\widehat{G_r} \neq G_r$. Sweep across a range of $e_s$ for different steps of $e_t$ and repeat steps 3-5 and find the values of $e_s$ and $e_t$ for which output RMS is minimal.

Figure 8:
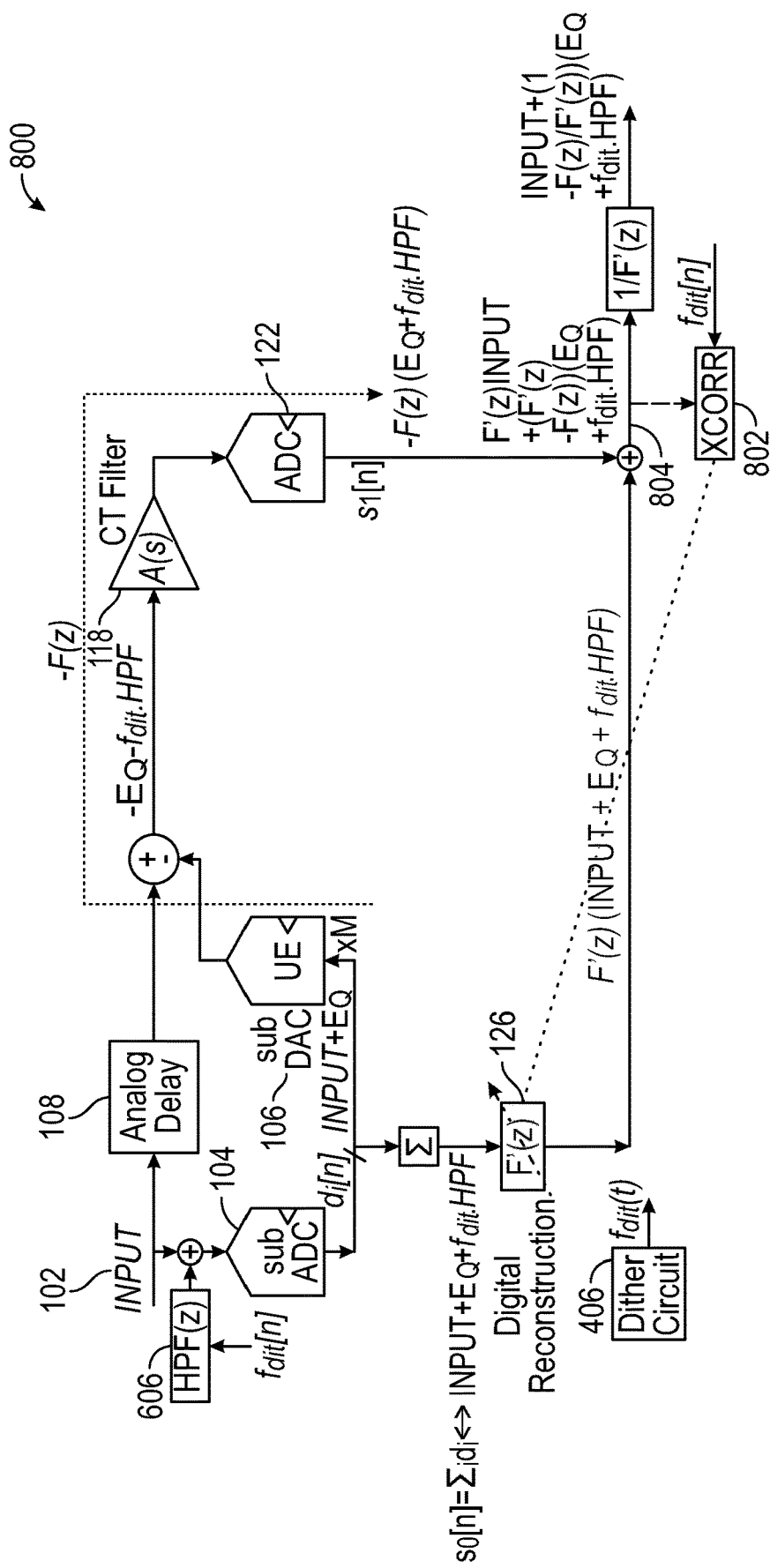
FIG. 8 is a schematic illustration of an alternative technique of CT ADC transfer function estimation.

FIG. 8 is a schematic illustration of an alternative technique of CT ADC transfer function estimation. FIG. 8 illustrates the fourth technique, which uses a known signal source at the input of the sub-ADC and uses a feedback-based technique for accurate transfer function estimation.

In the techniques described above with respect to FIGS. 4-7, the base of DRF estimation is through the injection of the PRBS DAC 302 and cross correlating the backend ADC output with the PRBS sequence to estimate the path it has traversed and thereby equating it to the path traversed by the sub-ADC 104. As an alternate solution, the path traversed by the dither sequence signal, $f_{dir}$, can be used as an estimate of the DRF transfer function. This can be done by cross-correlation of reconstructed output with the dither sequence signal, $f_{dir}$. As the estimated transfer function closely approaches the actual transfer function, the cross-correlation goes to a minimum.

In some examples, it can be desirable to include an optional high pass filter 606 configured to receive the dither sequence signal, $f_{dir}$, and apply a filtered representation of the dither sequence signal to an input of the sub-ADC 104.

Assuming that the high pass filter 606 a second order FIR HPF($h_{hp}(z)$) and assuming that the transfer function applied to the path is F'(z), the cross-correlation (XCORR 802) of the reconstructed data at the ADC output 804 with the dither sequence signal, $f_{dir}$, provides the following equation:

$$HPF(z)(F'(z) - F(z)) = \quad (1)$$
$$(h_{hp}[0] + h_{hp}[1]z^{-1})(F'(z) - F(z)) = (h_{hp}[0] + h_{hp}[1]z^{-1})$$
$$((f'[0] - f[0]) + (f'[1] - f[1])z^{-1} + (f'[2] - f[2])z^{-2} +$$

The CT ADC 800 can perform the following steps for this estimation technique:
1: Assuming a $5^{th}$ order response for f[n], then f'[n] can be [1, 0, 0, 0, 0] in the very first iteration.
2: Set increment variable 'i' to 0
3: Cross-correlate the final reconstructed ADC output 804 with the dither sequence signal, $f_{dir}$, using the cross-correlator circuit 802.

4: Compute f'[i] from equation (1) so that the tap 'i' of cross-correlator goes to 0

5: Increment 'i' and repeat steps 3 to 5 until all taps of f[n] have been computed The first tap measures the difference between $f[0]$ and $f'[0]$. Using the $1^{st}$ tap of the correlator to minimize $f'[0]-f[0]$ will then help in using the $2^{nd}$ tap to minimize $f'[1]-f[1]$ and so on. The algorithm can be updated to the number of taps desired. A tap count of 5 was chosen as an example. An equalizer can be added at the very end to compensate for the F'(z) transfer function undergone by sub-ADC output.

Figure 9:
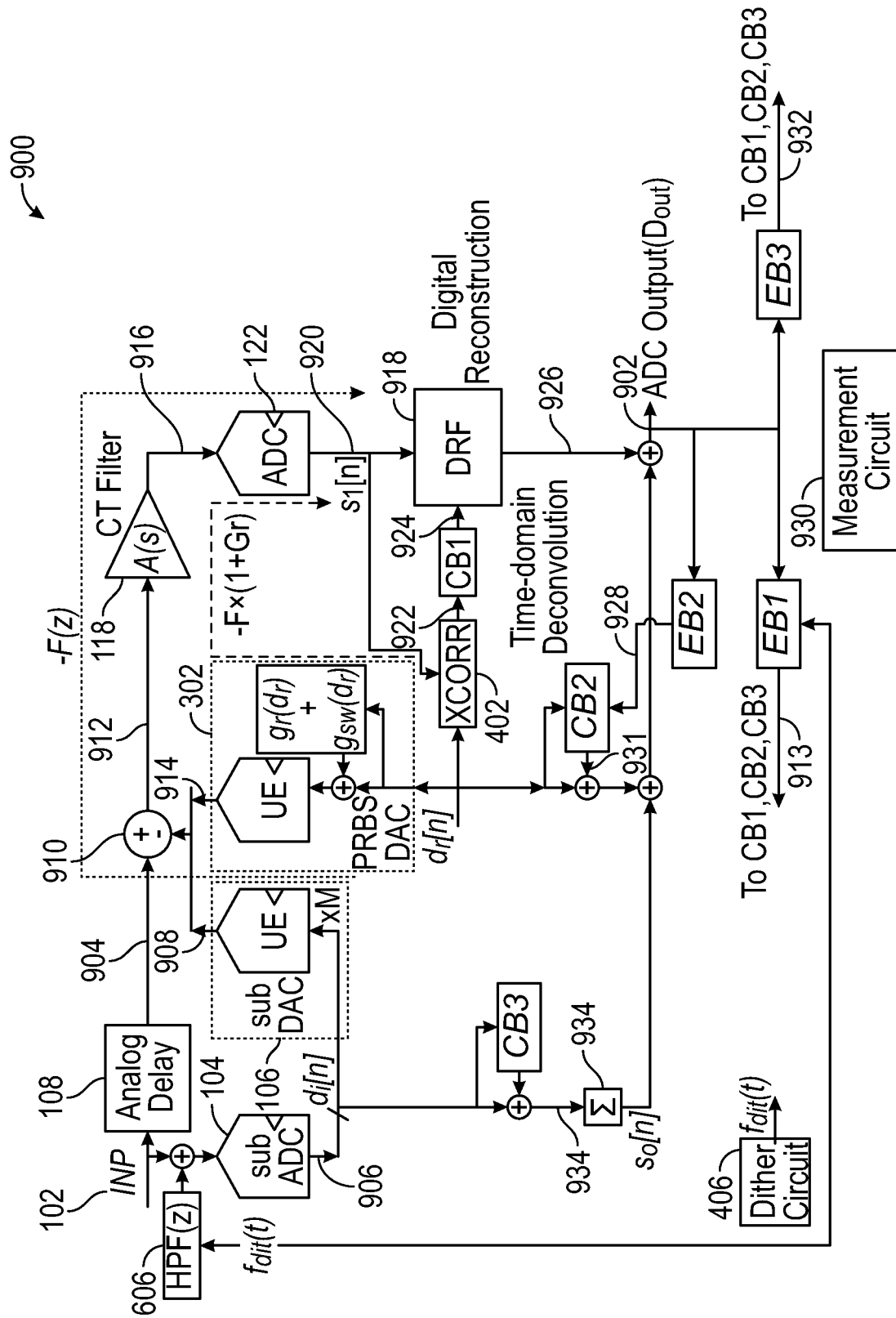
FIG. 9 is a schematic illustration of an example of a CT ADC configured to perform one or more of the digital correction techniques of FIGS. 4-7 to improve transfer function accuracy.

FIG. 9 is a schematic illustration of an example of a CT ADC configured to perform one or more of the digital correction techniques of FIGS. 4-7 to improve transfer function accuracy. For ease of explanation, the techniques of FIGS. 4-7 have been consolidated into a single figure, namely FIG. 9. FIG. 9 depicts a CT ADC 900 configured to perform one or more of the first through third techniques described above with respect to FIGS. 4-7.

The CT ADC 900 is configured to receive an analog input signal 102. The CT ADC 900 includes a delay circuit 108 configured to generate a delay circuit output signal 904 by applying a delay to the analog input signal 102. The CT ADC 900 further includes a sub-ADC circuit 104 (e.g., a quantizer) configured to generate a sub-ADC circuit output signal 906 ($d_r[n]$) based on the analog input signal 102.

A sub-DAC circuit 106 is coupled to receive the sub-ADC circuit output signal 906 and generate an analog representation 908 of the sub-ADC circuit output signal 104. The analog representation 908 of the first sub-ADC circuit output signal is subtracted from the delay circuit output signal 904 by a combiner circuit 910 (e.g., subtractor) to generate a residue signal 912.

In accordance with the techniques of this disclosure, the CT ADC 900 includes one or more error estimation circuits EB1-EB3 that are each configured to receive an ADC output signal Dout at an output node 902 and generate a corresponding error estimation circuit signal. The CT ADC 900 further includes one or more error correction circuits CB1-CB3 configured to receive a corresponding error estimation circuit signal and generate a digital error-correction signal. The output node 902 is coupled to an input of the one or more error estimation circuits EB1-EB3 and the output node 902 is configured to generate the ADC output signal Dout using: 1) the residue signal 912, 2) the sub-ADC circuit output signal 906, and 3) the digital error-correction signal generated by the one or more error correction circuits CB1-CB3.

Referring first to the error estimation block EB1 and error correction block CB1 example first, the CT ADC 900 can include a dither circuit 406 configured to generate a dither sequence signal, $f_{dit}$. The sub-ADC circuit 104 is coupled to the dither circuit 406 and configured to generate the sub-ADC circuit output signal 906 based on the analog input signal 102 and a representation of the dither sequence signal. For example, a filter, e.g., optional high pass filter 606, can coupled between the dither circuit 406 and the sub-ADC circuit 104 to filter the dither sequence signal, $f_{dit}$. The sub-ADC output $S_0$ and $d_r$ are summed with each other and then with $s_1$ after it is processed by the DRF to generate the final ADC output.

The error estimation circuit EB1 is configured to receive at least the dither sequence signal and generate an error estimation circuit signal 913 to the error correction circuit CB1 (and if also present, to the error correction circuit CB2 and/or the error correction circuit CB3).

As seen in FIG. 9, the CT ADC 900 further includes a second sub-DAC circuit 302 configured to receive a pseudo-random bit sequence signal $d_r[n]$, where an output 914 of the second sub-DAC circuit 302 is summed with the residue signal 912 by the combiner circuit 910 and applied to a CT filter circuit 118. A backend ADC circuit 122 is coupled between an output 916 of the CT filter circuit 118 and an input of a digital reconstruction filter (DRF) circuit 918. The backend ADC circuit 122 is configured to receive the output of the CT filter circuit 118 and generate a backend ADC circuit output signal 920 ($s_1[n]$).

The backend ADC output, $s_1[n]$ is cross correlated with $d_r[n]$ to generate the impulse response of the filter −F(z). This filter is then used to implement the digital reconstruction filter (DRF) 918 as 1/F(z). The reconstruction filter can also be implemented as two separate FIR filters A(z) and B(z)(F(z)=A(z)/B(z)), where A(z) lies in the sub-ADC path (s0[n]) and B(z) lies in the backend-ADC path (s1[n]).

A cross correlator circuit 402 is configured to receive and cross correlate the backend ADC circuit output signal 920 and the pseudo-random bit sequence signal $d_r[n]$ and generate a first cross correlator circuit output 922. The first cross correlator circuit output 922 represents an impulse response of the CT filter circuit 916, the backend ADC circuit 122, and the first sub-DAC circuit 106.

The error correction circuit CB1 is configured to receive the first cross correlator circuit output 922 and apply the digital error-correction signal 924, e.g., filter coefficients, to the digital reconstruction filter circuit 918, where an output 926 of the digital reconstruction filter circuit 918 is coupled to the output node 902. In addition, the error correction circuit CB1 is configured to receive the error estimation circuit signal 913 from the error estimation circuit EB1. The output of the error correction block CB1 is used to derive the DRF.

In some examples, the error correction circuit CB1 is configured to perform a time-domain deconvolution, such as was described above with respect to FIG. 6. In some examples, the error estimation circuit EB1 is configured to perform a cross correlation of the dither sequence signal, $f_{dit}$, and the ADC output signal Dout, such as was described above with respect to FIG. 6, to estimate the PRBS DAC's static ($\hat{e}_s$) and timing ($\hat{e}_t$) error mismatch terms (i.e.,) $\widehat{G_r}(z)$.

The error correction circuit CB1 takes the transfer function generated by the DRF cross correlator 402 and effectively divides it with the transfer function (1+ $\widehat{G_r}(z)$) with impulse response [1+$\hat{e}_s$+$\hat{e}_t$, −$\hat{e}_t$]. Here $\hat{e}_s$ and $\hat{e}_t$ represent estimates of the second sub-DAC circuit 302 slice's static ($e_s$) and timing ($e_t$) errors. Since the cross correlator outputs a time-domain impulse response, transfer function division is performed as a time-domain deconvolution of the cross-correlator output and the filter [1+$\hat{e}_s$+$\hat{e}_t$, −$\hat{e}_t$].

In some examples, a measurement circuit 930 can receive the ADC output signal Dout and measure the NSD without the presence of an input signal (foreground calibration) but in the presence of the dither sequence signal, $f_{dit}$, to estimate the static($\hat{e}_s$) and timing ($\hat{e}_t$) error mismatch terms (i.e.,) $\widehat{G_r}(z)$ of the second sub-DAC circuit 302.

In some examples, the measurement circuit 930 can receive the ADC output signal Dout and measure the root-mean-square (RMS) to estimate the static ($\hat{e}_s$) and timing ($\hat{e}_t$) error mismatch terms (i.e.,) $\widehat{G_r}(z)$ of the second sub-DAC circuit 302.

Referring next to the error estimation block EB2 and error correction block CB2 example, the CT ADC 900 can include the dither circuit 406 configured to generate a dither sequence signal, $f_{dit}$. The sub-ADC circuit 104 is coupled to the dither circuit 406 and configured to generate the sub-ADC circuit output signal 906 based on the analog input signal 102 and a representation of the dither sequence signal. For example, a filter, e.g., optional high pass filter 606, can coupled between the dither circuit 406 and the sub-ADC circuit 104 to filter the dither sequence signal, $f_{dit}$. The error estimation circuit EB1 is configured to receive at least the dither sequence signal and generate an error estimation circuit signal 913 to the error correction circuit CB1 (and if also present, to the error correction circuit CB2 and/or the error correction circuit CB3).

As seen in FIG. 9, the CT ADC 900 further includes a second sub-DAC circuit 302 configured to receive a pseudo-random bit sequence signal $d_r[n]$, where an output 914 of the second sub-DAC circuit 302 is summed with the residue signal 912 by the combiner circuit 910 and applied to a CT filter circuit 118. A backend ADC circuit 122 is coupled between an output 916 of the CT filter circuit 118 and an input of a digital reconstruction filter (DRF) circuit 918. The backend ADC circuit 122 is configured to receive the output of the CT filter circuit 118 and generate a backend ADC circuit output signal 920 ($s_1[n]$).

The error estimation circuit EB2 is coupled to the output node and configured to receive the ADC output signal Dout and generate the error estimation circuit signal 928. The error correction circuit CB2 is configured to receive the pseudo-random bit sequence signal $d_r[n]$ and the error estimation circuit signal 928 and generate the digital error-correction signal 931 based on the pseudo-random bit sequence signal $d_r[n]$ and error estimation circuit signal 928.

In some examples, the error correction circuit CB2 can include a first finite impulse response filter (FIR) circuit. For example, the error correction circuit CB2 can include a two-tap FIR filter with impulse response $[\hat{e}_s + \hat{e}_t, -\hat{e}_t]$ and with a function of the pseudo-random bit signal, thereby implementing the function:

$$\hat{q}_r(d_r) = \hat{e}_s d_r[n] + \hat{e}_t(d_r[n] - d_r[n-1]).$$

In some examples, the error estimation circuit EB2 is configured to perform a cross correlation of the ADC output signal and a function of the pseudo-random bit sequence signal, such as $d_r[n]$ multiplied by $d_r[n-1]$.

In some examples, the error estimation circuit EB2 and the error correction circuit CB2 can be used in combination with the error estimation circuit EB1 and the error correction circuit CB1. Such a system can perform a cross-correlation of ADC output Dout with the dither sequence signal, $f_{dit}$, to estimate the static ($\hat{e}_s$) and timing ($\hat{e}_t$) error mismatch terms (i.e.,) $\widehat{G_r}(z)$ of the second sub-DAC circuit 302.

In some examples, the measurement circuit 930 can receive the ADC output signal Dout and measure the NSD without the presence of an input signal (foreground calibration) but in the presence of the dither sequence signal, $f_{dit}$, to estimate the static ($\hat{e}_s$) and timing ($\hat{e}_t$) error mismatch terms (i.e.,) $\widehat{G_r}(z)$ of the second sub-DAC circuit 302.

In some examples, the measurement circuit 930 can receive the ADC output signal Dout and measure the root-mean-square (RMS) to estimate the static ($\hat{e}_s$) and timing ($\hat{e}_t$) error mismatch terms (i.e.,) $\widehat{G_r}(z)$ of the second sub-DAC circuit 302.

In some examples, the error correction circuit CB2 can implement the function $\widehat{g_{r,sw}}(d_r) = 0.5 \widehat{e_{sw}}(1 - d_r[n]) d_r[n-1])$.

In some examples, the error estimation circuit EB2 performs a calibration procedure to estimate $\widehat{e_{sw}}$ in the absence of input signal using a cross-correlation with product $(d_r[n] \cdot d_r[n-1])$ as a measurement metric.

In some examples, the error estimation circuit EB2 performs a calibration procedure to estimate $\widehat{e_{sw}}$ in the absence of an input signal using NSD as a measurement metric.

In some examples, the error estimation circuit EB2 and the error correction circuit CB2 can be used in combination with the error estimation circuit EB1 and the error correction circuit CB1. As such, techniques described above with respect to each can be used together unless stated elsewhere to the contrary.

Referring next to the error estimation block EB3 and error correction block CB3 example, the CT ADC 900 can include a second sub-DAC circuit 302 configured to receive a pseudo-random bit sequence signal $d_r[n]$, where an output 914 of the second sub-DAC circuit 302 is summed with the residue signal 912 by the combiner circuit 910 and applied to a CT filter circuit 118. A backend ADC circuit 122 is coupled between an output 916 of the CT filter circuit 118 and an input of a digital reconstruction filter (DRF) circuit 918. The backend ADC circuit 122 is configured to receive the output of the CT filter circuit 118 and generate a backend ADC circuit output signal 920 ($s_1[n]$).

The error estimation circuit EB3 is coupled to the output node 902 and configured to receive the ADC output signal Dout and generate the error estimation circuit signal 932. The error correction circuit CB3 is configured to receive the sub-ADC circuit output signal 906 and the error estimation circuit signal 932 and generate the digital error-correction signal 934 based on the sub-ADC circuit output 906 signal and the error estimation circuit signal 932.

Each output bit $d_i$ of the sub-ADC circuit 104 can be applied to the error correction circuit CB3 whose output is summed with individual $d_i$ bits and then summed together by combiner circuit 934 to generate an output $s_0$. This output is then summed with the PRBS $d_r$ and the output 926 of the digital reconstruction filter circuit 918.

In some examples, the error estimation circuit EB3 can be used in combination with error-correction circuits CB1 and/or CB2. The error estimation circuit EB1 can also be used in combination with error correction circuits CB1 and/or CB2. The error estimation circuits EB1 and EB3 can be used in combination with CB3. The error estimation circuit EB2 can be used in conjunction with CB2. Techniques described above with respect to each can be used together unless stated elsewhere to the contrary. As such, the error estimation circuit signal 932 can be applied to the error correction circuit CB1 and/or the error correction circuit CB2, if present.

In some examples, the error correction circuit CB3 includes a finite impulse response filter (FIR) circuit. For example, the error correction circuit CB3 can implement an array of two-tap FIR filters (one for each bit output by the sub-ADC circuit 104) with impulse response $[-\hat{e}_s - \hat{e}_t, \hat{e}_t]$, thereby implementing the function $-\widehat{g_r}(d_i) = -\hat{e}_s d_i[n] - \hat{e}_t(d_i[n] - d_r[n-1])$.

In some examples, the error estimation circuit EB3 includes either a low pass filter or a high pass filter.

In some examples, the measurement circuit 930 can receive the ADC output signal Dout and measure the NSD without the presence of an input signal (foreground calibration) but in the presence of the dither sequence signal, $f_{dit}$, to estimate the static($\widehat{e_s}$) and timing ($\widehat{e_t}$) error mismatch terms (i.e.,) $\widehat{G_r}(z)$ of the second sub-DAC circuit 302.

In some examples, the measurement circuit 930 can receive the ADC output signal Dout and measure the root-mean-square (RMS) to estimate the static ($\widehat{e_s}$) and timing ($\widehat{e_t}$) error mismatch terms (i.e.,) $\widehat{G_r}(z)$ of the second sub-DAC circuit 302.

Figure 10:
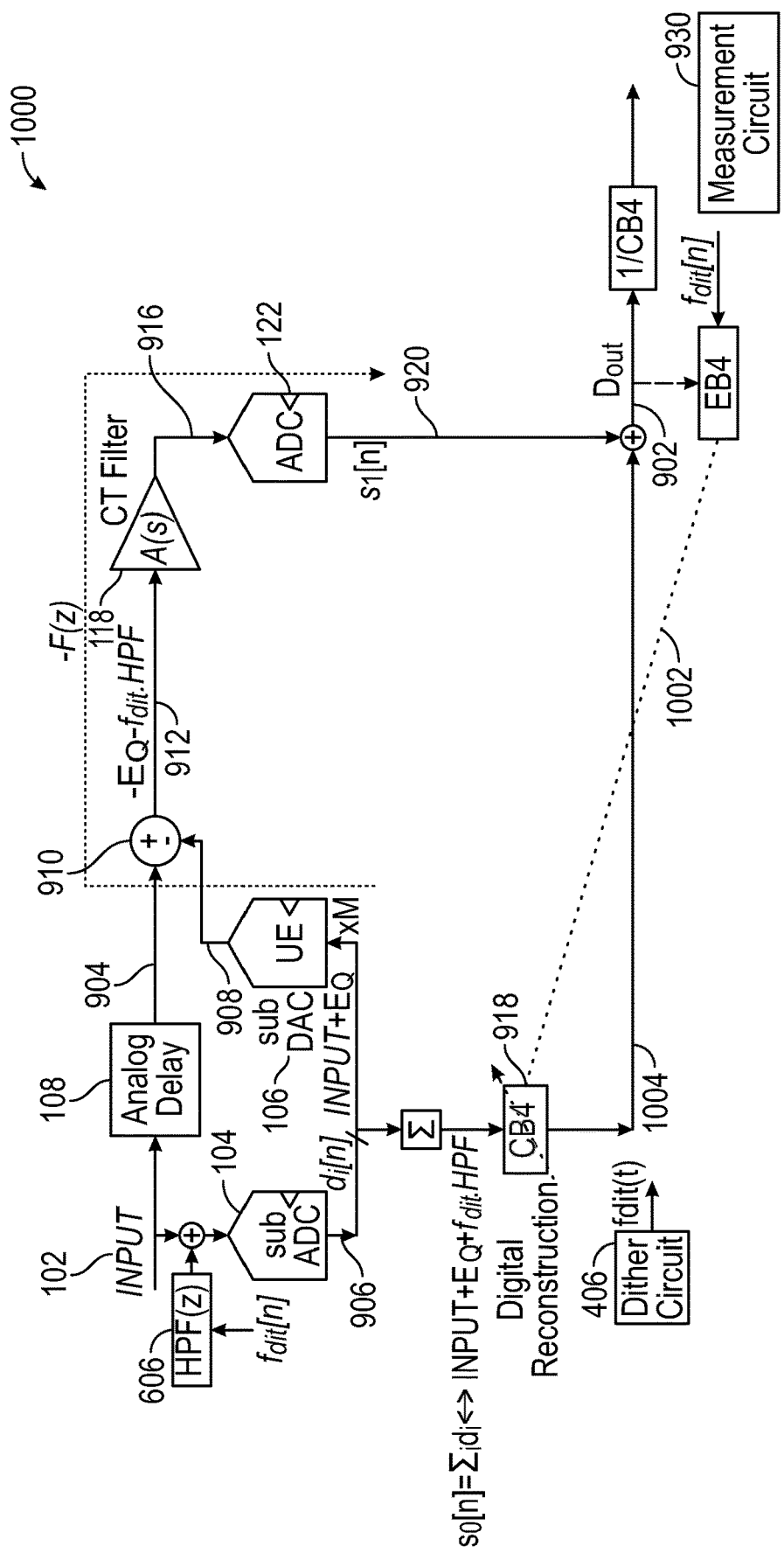
FIG. 10 is a schematic illustration of the CT ADC of FIG. 8.

FIG. 10 is a schematic illustration of the CT ADC of FIG. 8. FIG. 10 illustrates the fourth technique, which uses a known signal source at the input of the sub-ADC and uses a feedback-based technique for accurate transfer function estimation. Like in FIG. 9, the CT ADC 1000 of FIG. 10 includes an error estimation circuit EB4 that is configured to receive an ADC output signal Dout at an output node 902 and generate a corresponding error estimation circuit signal 1002. The CT ADC 1000 further includes an error correction circuit CB4 configured to receive the error estimation circuit signal 1002 and generate a digital error-correction signal 1004.

The CT ADC 1000 is configured to receive an analog input signal 102. The CT ADC 1000 can include a dither circuit 406 configured to generate a dither sequence signal, $f_{dit}$. The sub-ADC circuit 104 is coupled to the dither circuit 406 and configured to generate the sub-ADC circuit output signal 906 based on the analog input signal 102 and a representation of the dither sequence signal. For example, a filter, e.g., optional high pass filter 606, can coupled between the dither circuit 406 and the sub-ADC circuit 104 to filter the dither sequence signal, $f_{dit}$. The individual thermometric bits of the sub-ADC, $d_i$, are summed to generate the binary output $S_0$. The bits $S_0$ and $d_r$ are summed with each other and then with $s_1$ after it is processed by the DRF to generate the final ADC output.

The CT ADC 1000 includes a delay circuit 108 configured to generate a delay circuit output signal 904 by applying a delay to the analog input signal 102. The analog representation 908 of the first sub-ADC circuit output signal 906 is subtracted from the delay circuit output signal 904 by a combiner circuit 910 (e.g., subtractor) to generate a residue signal 912. Unlike FIG. 9, the CT ADC 1000 does not include a second sub-DAC circuit 302 configured to receive a pseudo-random bit sequence signal $d_r[n]$.

The residue signal 912 is applied to a CT filter circuit 118. A backend ADC circuit 122 is coupled between an output 916 of the CT filter circuit 118 and an input of a digital reconstruction filter (DRF) circuit 918. The backend ADC circuit 122 is configured to receive the output of the CT filter circuit 118 and generate a backend ADC circuit output signal 920 ($s_1[n]$).

The output node 902 is coupled to an input of the error estimation circuit EB4 and the error estimation circuit is configured to generate the error estimation circuit signal 1002. In some examples, the error estimation circuit EB4 is configured to perform a cross correlation of the dither sequence signal, $\theta_{dit}$ with the ADC output signal Dout, such as to estimate the transfer function undergone by sub-ADC data.

The error correction circuit CB4 is configured to receive the sub-ADC circuit output signal 906 and the error estimation circuit signal 1002 and generate the digital error-correction signal 1004 based on the sub-ADC circuit output signal 906 and the error estimation circuit signal 1002.

The output node 902 is configured to generate the ADC output signal Dout using: 1) the residue signal 912, 2) the sub-ADC circuit output signal 906, and 3) the digital error-correction signal generated by the error correction circuits CB4.

Figure 11:
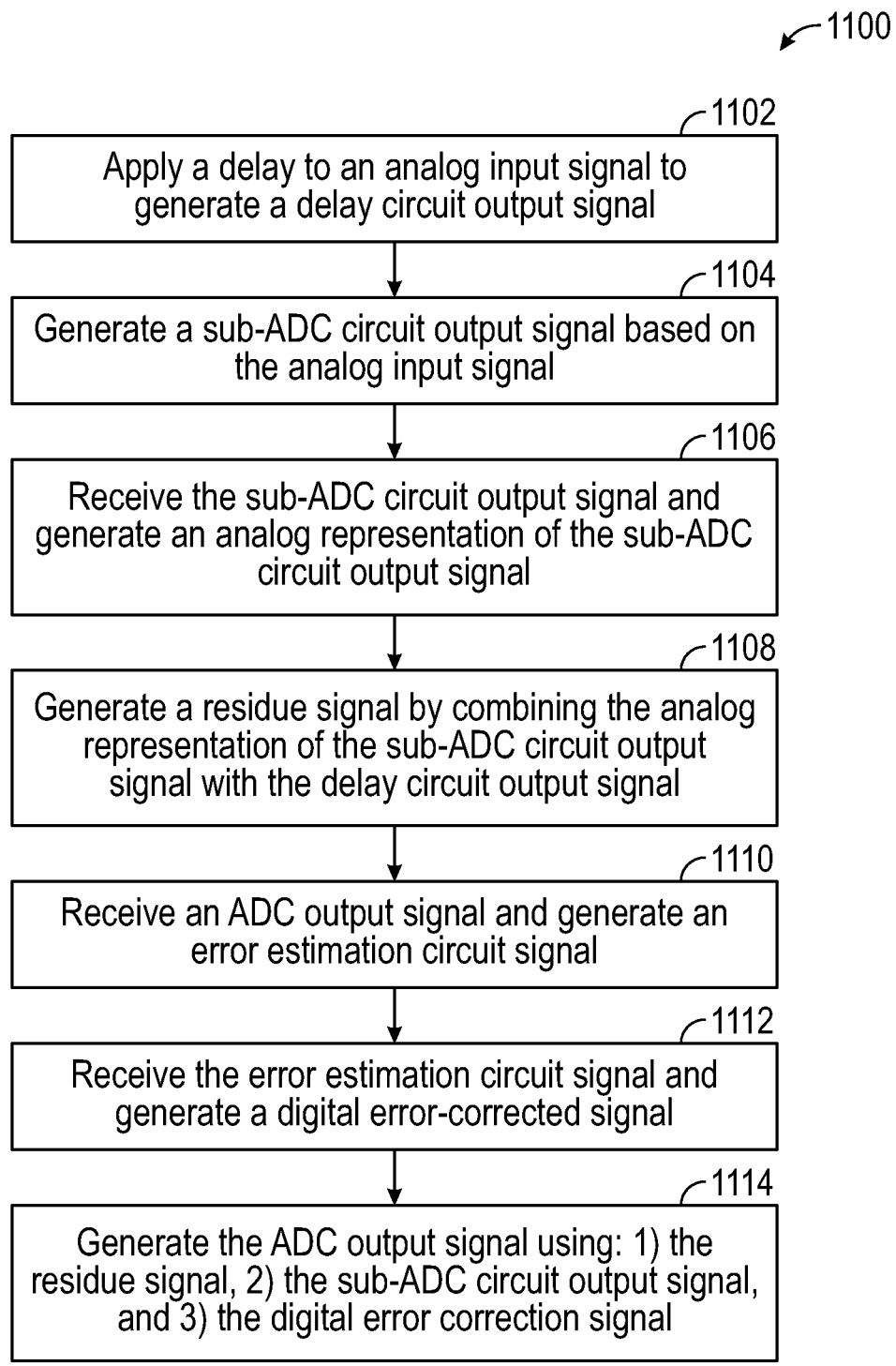
FIG. 11 is a flow diagram of an example of a method of operating a continuous-time (CT) analog-to-digital converter (ADC).

FIG. 11 is a flow diagram of an example of a method 1100 of operating a continuous-time (CT) analog-to-digital converter (ADC). At block 1102, the method 1100 includes applying a delay to an analog input signal to generate a delay circuit output signal. For example, the delay circuit 108 can apply a delay to the analog input signal 102 to generate a delay circuit output signal 904, such as shown in FIG. 9 or 10.

At block 1104, the method 1100 includes generating a sub-ADC circuit output signal based on the analog input signal. For example, the sub-ADC circuit 104 can generate a sub-ADC circuit output signal 906 based on the analog input signal 102, such as shown in FIG. 9 or 10.

At block 1106, the method 1100 includes receiving the sub-ADC circuit output signal and generating an analog representation of the sub-ADC circuit output signal. For example, the sub-DAC circuit 106 can receive the sub-ADC circuit output signal 906 and generate the analog representation 908, such as shown in FIG. 9 or 10.

At block 1108, the method 1100 includes generating a residue signal by combining an analog representation of the sub-ADC circuit output signal with the delay circuit output signal. For example, the combiner circuit 910 can generate a residue signal 912 by combining the analog representation 908 with the delay circuit output signal 904, such as shown in FIG. 9 or 10.

At block 1110, the method 1100 includes receiving an ADC output signal and generating an error estimation circuit signal. For example, one or more of the error estimation circuits EB1-EB4 can receive the ADC output Dout and generate a corresponding error estimation circuit signal, such as shown in FIG. 9 or 10.

At block 1112, the method 1100 includes receiving the error estimation circuit signal and generating a digital error-correction signal. For example, one or more of the error correction circuits CB1-CB4 can receive a corresponding error estimation circuit signal and generate a digital error-correction signal, such as shown in FIG. 9 or 10.

At block 1114, the method 1100 includes generating the ADC output signal using: 1) the residue signal, 2) the sub-ADC circuit output signal, and 3) the digital error-correction signal. For example, the CT ADC 900 of FIG. 9 or the CT ADC 1000 can generate an ADC output signal DOUT using: 1) the residue signal 912, 2) the sub-ADC circuit output signal 906, and 3) the digital error-correction signal. In some examples, the method 1100 can further include generating a dither sequence signal, wherein generating the sub-ADC circuit output signal is based on the analog input signal and a representation of the dither sequence signal; receiving a pseudo-random bit sequence signal, wherein an output of a second sub-DAC circuit is summed with the residue signal and applied to a CT filter circuit; receiving the output of the CT filter circuit and generating a backend ADC circuit output;

cross correlating the backend ADC circuit output and the pseudo-random bit sequence signal and generating a first cross correlator circuit output representing an impulse response of the CT filter circuit, the backend ADC circuit, and the first sub-DAC circuit; and receiving, via an error correction circuit, the first cross correlator circuit output and applying the digital error-correction signal to a digital reconstruction filter circuit, wherein an output of the digital reconstruction filter circuit is coupled to the output node.

In some examples, the method 1100 can further include generating a dither sequence signal, wherein generating the sub-ADC circuit output signal is based on the analog input signal and a representation of the dither sequence signal; receiving a pseudo-random bit sequence signal; summing an output of a second sub-DAC circuit with the residue signal and applied to a CT filter circuit; receiving the output of the CT filter circuit and generating a backend ADC circuit output; coupling the error estimation circuit to the output node to receive the ADC output signal and generate the error estimation circuit signal; receiving, via an error correction circuit, the pseudo-random bit sequence signal and the error estimation circuit signal and generating the digital error-correction signal based on the pseudo-random bit sequence signal and error estimation circuit signal.

In some examples, the method 1100 can further include receiving a pseudo-random bit sequence signal, wherein an output of a second sub-DAC circuit is summed with the residue signal and applied to a CT filter circuit; receiving the output of the CT filter circuit and generating a backend ADC circuit output; coupling the error estimation circuit to the output node to receive the ADC output signal and generate the error estimation circuit signal; receiving, via an error correction circuit, the sub-ADC circuit output signal and the error estimation circuit signal and generating the digital error-correction signal based on the sub-ADC circuit output signal and the error estimation circuit signal.

In some examples, the method 1100 can further include generating a dither sequence signal, wherein generating the sub-ADC circuit output signal is based on the analog input signal and a representation of the dither sequence signal; receiving the residue signal and generating a CT filter circuit output signal; receiving the output of the CT filter circuit and generating a backend ADC circuit output that is applied to the output node; receiving, via an error correction circuit, the sub-ADC circuit output signal and the error estimation circuit signal and generating the digital error-correction signal based on the sub-ADC circuit output signal and the error estimation circuit signal.

Various Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following aspects, the terms "including" and "comprising" are open-ended, that is, a system, device, article, composition, formulation, or process that includes elements in addition to those listed after such a term in an aspect are still deemed to fall within the scope of that aspect. Moreover, in the following aspects, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the aspects. Also, in the above Detailed Description, various features may be grouped together to streamline the disclosure. This should not be interpreted as intending that an unclaimed disclosed feature is essential to any aspect. Rather, inventive subject matter may lie in less than all features of a particular disclosed embodiment. Thus, the following aspects are hereby incorporated into the Detailed Description as examples or embodiments, with each aspect standing on its own as a separate embodiment, and it is contemplated that such embodiments may be combined with each other in various combinations or permutations. The scope of the invention should be determined with reference to the appended aspects, along with the full scope of equivalents to which such aspects are entitled.

The claimed invention is:

1. A continuous-time (CT) analog-to-digital converter (ADC), comprising:
   a delay circuit configured to generate a delay circuit output signal by applying a delay to an analog input signal;
   a sub-ADC circuit configured to generate a sub-ADC circuit output signal based on the analog input signal;
   a first sub-DAC circuit coupled to receive the sub-ADC circuit output signal and generate an analog representation of the sub-ADC circuit output signal, wherein the analog representation of the sub-ADC circuit output signal is combined with the delay circuit output signal to generate a residue signal;

an error estimation circuit configured to receive an ADC output signal and generate an error estimation circuit signal;

an error correction circuit configured to receive the error estimation circuit signal and generate a digital error-correction signal; and an output node coupled to an input of the error estimation circuit and configured to generate the ADC output signal using: 1) the residue signal, 2) the sub-ADC circuit output signal, and 3) the digital error-correction signal.

2. The CT ADC of claim 1, further comprising:

a dither circuit configured to generate a dither sequence signal, wherein the sub-ADC circuit is coupled to the dither circuit, wherein the sub-ADC circuit is configured to generate the sub-ADC circuit output signal based on the analog input signal and a representation of the dither sequence signal, and wherein the error estimation circuit is configured to receive at least the dither sequence signal;

a second sub-DAC circuit configured to receive a pseudo-random bit sequence signal, wherein an output of the second sub-DAC circuit is summed with the residue signal and applied to a CT filter circuit;

a backend ADC circuit coupled between an output of the CT filter circuit and an input of a digital reconstruction filter circuit, the backend ADC circuit configured to receive the output of the CT filter circuit and generate a backend ADC circuit output; and a first cross correlator circuit configured to receive and cross correlate the backend ADC circuit output and the pseudo-random bit sequence signal and generate a first cross correlator circuit output representing an impulse response of the CT filter circuit, the backend ADC circuit, and the first sub-DAC circuit, wherein the error correction circuit is configured to receive the first cross correlator circuit output and apply the digital error-correction signal to the digital reconstruction filter circuit, wherein an output of the digital reconstruction filter circuit is coupled to the output node.

3. The CT ADC of claim 2, wherein the first error correction circuit is configured to perform a time-domain deconvolution.

4. The CT ADC of claim 2, wherein the error estimation circuit is configured to perform a cross correlation of the dither sequence signal and the ADC output signal.

5. The CT ADC of claim 1, further comprising:

a dither circuit configured to generate a pseudo-random bit sequence signal;

a second sub-DAC circuit coupled to the dither circuit and configured to receive the pseudo-random bit sequence signal, wherein an output of the second sub-DAC circuit is summed with the residue signal and applied to a CT filter circuit;

a backend ADC circuit coupled between an output of the CT filter circuit and an input of a digital reconstruction filter circuit, the backend ADC circuit configured to receive the output of the CT filter circuit and generate a backend ADC circuit output, wherein an output of the digital reconstruction filter circuit is coupled to the output node, wherein the error estimation circuit is coupled to the output node and configured to receive the ADC output signal and generate the error estimation circuit signal, and the error correction circuit is configured to receive the pseudo-random bit sequence signal and the error estimation circuit signal and generate the digital error-correction signal based on the pseudo-random bit sequence signal and the error estimation circuit signal.

6. The CT ADC of claim 5, wherein the error correction circuit is configured to implement a first finite impulse response filter (FIR) circuit along with a function of the pseudo-random bit sequence signal.

7. The CT ADC of claim 5, wherein the error estimation circuit is configured to perform a cross correlation of the ADC output signal and a function of the pseudo-random bit sequence signal.

8. The CT ADC of claim 1, further comprising:

a dither circuit configured to generate a dither sequence signal, wherein the sub-ADC circuit is coupled to the dither circuit, wherein the sub-ADC circuit is configured to generate the sub-ADC circuit output signal based on the analog input signal and a representation of the dither sequence signal, and wherein the error estimation circuit is configured to receive at least the dither sequence signal;

a second sub-DAC circuit configured to receive a pseudo-random bit sequence signal, wherein an output of the second sub-DAC circuit is summed with the residue signal and applied to a CT filter circuit; and a backend ADC circuit coupled between an output of the CT filter circuit and an input of a digital reconstruction filter circuit, the backend ADC circuit configured to receive the output of the CT filter circuit and generate a backend ADC circuit output, wherein an output of the digital reconstruction filter circuit is coupled to the output node, wherein the error estimation circuit is coupled to the output node and configured to receive the ADC output signal and generate the error estimation circuit signal, and wherein the error correction circuit is configured to receive the sub-ADC circuit output signal and the error estimation circuit signal and generate the digital error-correction signal based on the sub-ADC circuit output signal and the error estimation circuit signal.

9. The CT ADC of claim 8, wherein the error correction circuit includes a finite impulse response filter (FIR) circuit.

10. The CT ADC of claim 8, wherein the error estimation circuit is configured to include a filter.

11. The CT ADC of claim 1, further comprising:

a dither circuit configured to generate a dither sequence signal, wherein the sub-ADC circuit is coupled to the dither circuit, wherein the sub-ADC circuit is configured to generate the sub-ADC circuit output signal based on the analog input signal and a representation of the dither sequence signal, and wherein the error estimation circuit is configured to receive at least the dither sequence signal;

a CT filter circuit configured to receive the residue signal and generate a CT filter circuit output signal; and a backend ADC circuit coupled between the CT filter circuit and the output node, the backend ADC circuit configured to receive the CT filter circuit output signal and generate and apply a backend ADC circuit output to the output node, wherein the error correction circuit is configured to receive the sub-ADC circuit output signal and the error estimation circuit signal and generate the digital error-correction signal based on the sub-ADC circuit output signal and the error estimation circuit signal.

12. The CT ADC of claim 11, wherein the error estimation circuit is configured to perform a cross correlation of the dither sequence signal with the ADC output signal.

13. A method of operating a continuous-time (CT) analog-to-digital converter (ADC), the method comprising:
applying a delay to an analog input signal to generate a delay circuit output signal;
generating a sub-ADC circuit output signal based on the analog input signal;
receiving, via a first sub-DAC circuit, the sub-ADC circuit output signal and generating an analog representation of the sub-ADC circuit output signal;
generating a residue signal by combining an analog representation of the sub-ADC circuit output signal with the delay circuit output signal;
receiving an ADC output signal and generating an error estimation circuit signal;
receiving the error estimation circuit signal and generating a digital error-correction signal; and
generating the ADC output signal at an output node using: 1) the residue signal, 2) the sub-ADC circuit output signal, and 3) the digital error-correction signal.

14. The method of claim 13, comprising:
generating a dither sequence signal, wherein generating the sub-ADC circuit output signal is based on the analog input signal and a representation of the dither sequence signal;
receiving, via a second sub-DAC circuit, a pseudo-random bit sequence signal, wherein an output of the second sub-DAC circuit is summed with the residue signal and applied to a CT filter circuit;
receiving the output of the CT filter circuit and generating, via a backend ADC circuit, a backend ADC circuit output;
cross correlating the backend ADC circuit output and the pseudo-random bit sequence signal and generating a first cross correlator circuit output representing an impulse response of the CT filter circuit, the backend ADC circuit, and the first sub-DAC circuit; and
receiving, via an error correction circuit, the first cross correlator circuit output and applying the digital error-correction signal to a digital reconstruction filter circuit, wherein an output of the digital reconstruction filter circuit is coupled to the output node.

15. The method of claim 13, comprising:
generating a dither sequence signal, wherein generating the sub-ADC circuit output signal is based on the analog input signal and a representation of the dither sequence signal;
receiving a pseudo-random bit sequence signal;
summing an output of a second sub-DAC circuit with the residue signal and applied to a CT filter circuit;
receiving the output of the CT filter circuit and generating a backend ADC circuit output;
coupling an error estimation circuit to the output node to receive the ADC output signal and generate the error estimation circuit signal; and
receiving, via an error correction circuit, the pseudo-random bit sequence signal and the error estimation circuit signal and generating the digital error-correction signal based on the pseudo-random bit sequence signal and the error estimation circuit signal.

16. The method of claim 13, comprising:
receiving a pseudo-random bit sequence signal, wherein an output of a second sub-DAC circuit is summed with the residue signal and applied to a CT filter circuit;
receiving the output of the CT filter circuit and generating a backend ADC circuit output;
coupling an error estimation circuit to the output node to receive the ADC output signal and generate the error estimation circuit signal; and
receiving, via an error correction circuit, the sub-ADC circuit output signal and the error estimation circuit signal and generating the digital error-correction signal based on the sub-ADC circuit output signal and the error estimation circuit signal.

17. The method of claim 13, further comprising:
generating a dither sequence signal, wherein generating the sub-ADC circuit output signal is based on the analog input signal and a representation of the dither sequence signal;
receiving the residue signal and generating a CT filter circuit output signal;
receiving the CT filter circuit output signal and generating a backend ADC circuit output that is applied to the output node; and
receiving, via an error correction circuit, the sub-ADC circuit output signal and the error estimation circuit signal and generating the digital error-correction signal based on the sub-ADC circuit output signal and the error estimation circuit signal.

18. A continuous-time (CT) analog-to-digital converter (ADC), comprising:
a delay circuit configured to generate a delay circuit output signal by applying a delay to an analog input signal;
a sub-ADC circuit configured to generate a sub-ADC circuit output signal based on the analog input signal;
a first sub-DAC circuit coupled to receive the sub-ADC circuit output signal and generate an analog representation of the sub-ADC circuit output signal, wherein the analog representation of the sub-ADC circuit output signal is combined with the delay circuit output signal to generate a residue signal;
means for receiving an ADC output signal and generating an error estimation circuit signal;
means for receiving the error estimation circuit signal and generating a digital error-correction signal; and
an output node coupled to an input of the means for receiving the ADC output signal and generating the error estimation circuit signal and configured to generate the ADC output signal using: 1) the residue signal, 2) the sub-ADC circuit output signal, and 3) the digital error-correction signal.

19. The CT ADC of claim 18, further comprising:
a dither circuit configured to generate a dither sequence signal, wherein the sub-ADC circuit is coupled to the dither circuit, wherein the sub-ADC circuit is configured to generate the sub-ADC circuit output signal based on the analog input signal and a representation of the dither sequence signal, and wherein the means for receiving the ADC output signal and generating the error estimation circuit signal is configured to receive at least the dither sequence signal.

20. The CT ADC of claim 18, further comprising:
a dither circuit configured to generate a pseudo-random bit sequence signal; and
a second sub-DAC circuit coupled to the dither circuit and configured to receive the pseudo-random bit sequence signal, wherein an output of the second sub-DAC circuit is summed with the residue signal and applied to a CT filter circuit.

\* \* \* \* \*